(12) United States Patent
Forrester et al.

(10) Patent No.: US 7,071,776 B2
(45) Date of Patent: Jul. 4, 2006

(54) SYSTEMS AND METHODS FOR CONTROLLING OUTPUT POWER IN A COMMUNICATION DEVICE

(75) Inventors: Tim Forrester, San Diego, CA (US); Jorge Fabrega-Sanchez, San Diego, CA (US); Gregory Poilasne, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 36 days.

(21) Appl. No.: 10/806,763

(22) Filed: Mar. 22, 2004

(65) Prior Publication Data

US 2005/0093624 A1 May 5, 2005

Related U.S. Application Data

(63) Continuation-in-part of application No. 10/035,596, filed on Oct. 22, 2001, now Pat. No. 6,710,651.

(51) Int. Cl.
    *H03G 3/20* (2006.01)
(52) U.S. Cl. .................. 330/129; 330/207 P; 455/115; 455/126; 455/127
(58) Field of Classification Search ............... 330/129, 330/207 P; 455/115.1, 126–127
    See application file for complete search history.

(56) References Cited

U.S. PATENT DOCUMENTS

| | | | |
|---|---|---|---|
| 2,843,797 A * | 7/1958 | Boyd .......................... 315/3.5 |
| 3,239,838 A | 3/1966 | Kelleher | |
| 3,392,464 A * | 7/1968 | MacDonald ................. 37/375 |
| 3,413,543 A | 11/1968 | Schubring et al. | |
| 3,569,795 A | 3/1971 | Gikow | |
| 3,676,803 A | 7/1972 | Simmons | |
| 3,678,305 A | 7/1972 | George | |
| 3,680,135 A | 7/1972 | Boyer | |
| 3,737,814 A | 6/1973 | Pond | |
| 3,739,299 A | 6/1973 | Adler | |
| 3,836,874 A | 9/1974 | Minoru et al. | |
| 3,852,669 A * | 12/1974 | Bowman et al. ............ 455/117 |
| 3,918,012 A | 11/1975 | Peuzin | |
| 4,019,150 A * | 4/1977 | Lurey et al. ................ 455/117 |
| 4,122,400 A * | 10/1978 | Medendorp et al. ..... 330/207 P |
| 4,236,125 A | 11/1980 | Bernard et al. | |
| 4,475,108 A | 10/1984 | Moser | |
| 4,484,157 A | 11/1984 | Helle et al. | |
| 4,494,081 A | 1/1985 | Lea et al. | |

(Continued)

FOREIGN PATENT DOCUMENTS

DE    40 36 866    7/1991

(Continued)

OTHER PUBLICATIONS

Chandler, S.R. et al., "Active Varactor Tunable Bandpass Filter," IEEE Microwave and Guided Wave Letters, vol. 3, No. 3, Mar. 1993, pp. 70-71.

(Continued)

*Primary Examiner*—Rexford Barnie
*Assistant Examiner*—Khai M. Nguyen

(57) ABSTRACT

A mismatch detector including a directional device adapted to couple signals across the device and a detector coupled to a port on the directional device and configured to measure a reflected power a second detector coupled to a port on the directional device and configured to measure a transmit power. The mismatch detector may be used in wireless communication devices, including, but not limited to mobile wireless devices, base stations, and communication systems.

9 Claims, 15 Drawing Sheets

U.S. PATENT DOCUMENTS

| | | | |
|---|---|---|---|
| 4,525,720 A | 6/1985 | Corzine et al. | |
| 4,626,800 A | 12/1986 | Murakami et al. | |
| 4,704,573 A * | 11/1987 | Turner, Jr. | 324/646 |
| 4,733,328 A | 3/1988 | Blazej | |
| 4,736,169 A | 4/1988 | Weaver et al. | |
| 4,737,797 A | 4/1988 | Siwiak et al. | |
| 4,746,925 A | 5/1988 | Toriyama | |
| 4,792,939 A | 12/1988 | Hikita et al. | |
| 4,799,066 A * | 1/1989 | Deacon | 343/861 |
| 4,835,499 A | 5/1989 | Pickett | |
| 4,835,540 A | 5/1989 | Haruyama et al. | |
| 4,847,626 A | 7/1989 | Kahler et al. | |
| 4,908,853 A | 3/1990 | Matsumoto | |
| 4,975,604 A | 12/1990 | Barta | |
| 5,038,112 A * | 8/1991 | O'Neill | 330/207 P |
| 5,150,075 A * | 9/1992 | Hietala et al. | 330/279 |
| 5,166,857 A | 11/1992 | Avanic et al. | |
| 5,173,709 A | 12/1992 | Lauro et al. | |
| 5,212,463 A | 5/1993 | Babbitt et al. | |
| 5,216,392 A | 6/1993 | Fraser et al. | |
| 5,227,748 A | 7/1993 | Sroka | |
| 5,231,407 A | 7/1993 | McGirr et al. | |
| 5,293,408 A | 3/1994 | Takahashi et al. | |
| 5,307,033 A | 4/1994 | Koscica et al. | |
| 5,325,099 A | 6/1994 | Nemit et al. | |
| 5,337,006 A * | 8/1994 | Miyazaki | 330/130 |
| 5,388,021 A | 2/1995 | Stahl | |
| 5,406,163 A | 4/1995 | Carson et al. | |
| 5,416,803 A | 5/1995 | Janer | |
| 5,427,988 A | 6/1995 | Sengupta et al. | |
| 5,450,092 A | 9/1995 | Das | |
| 5,451,915 A | 9/1995 | Katzin et al. | |
| 5,459,123 A | 10/1995 | Das | |
| 5,472,935 A | 12/1995 | Yandrofski et al. | |
| 5,479,139 A | 12/1995 | Koscica et al. | |
| 5,483,680 A * | 1/1996 | Talbot | 455/107 |
| 5,495,215 A | 2/1996 | Newell et al. | |
| 5,496,795 A | 3/1996 | Das | |
| 5,496,796 A | 3/1996 | Das | |
| 5,502,422 A | 3/1996 | Newell et al. | |
| 5,525,942 A | 6/1996 | Horii et al. | |
| 5,557,286 A | 9/1996 | Varadan et al. | |
| 5,561,307 A | 10/1996 | Mihara et al. | |
| 5,561,407 A | 10/1996 | Koscica et al. | |
| 5,564,086 A * | 10/1996 | Cygan et al. | 455/126 |
| 5,574,410 A | 11/1996 | Collins et al. | |
| 5,577,025 A | 11/1996 | Skinner | |
| 5,583,524 A | 12/1996 | Milroy | |
| 5,589,845 A | 12/1996 | Yandrofski | |
| 5,600,279 A | 2/1997 | Mori | |
| 5,617,104 A | 4/1997 | Das | |
| 5,640,042 A | 6/1997 | Koscica et al. | |
| 5,649,306 A | 7/1997 | Vannatta et al. | |
| 5,652,599 A | 7/1997 | Wallace et al. | |
| 5,673,188 A | 9/1997 | Lusher et al. | |
| 5,697,074 A * | 12/1997 | Makikallio et al. | 455/126 |
| 5,701,595 A | 12/1997 | Green, Jr. | |
| 5,721,194 A | 2/1998 | Yandrofski et al. | |
| 5,729,239 A | 3/1998 | Rao | |
| 5,777,524 A | 7/1998 | Wojewoda et al. | |
| 5,777,839 A | 7/1998 | Sameshima et al. | |
| 5,778,308 A * | 7/1998 | Sroka et al. | 455/115.1 |
| 5,830,591 A | 11/1998 | Sengupta et al. | |
| 5,834,975 A | 11/1998 | Bartlett et al. | |
| 5,864,932 A | 2/1999 | Evans et al. | |
| 5,870,670 A | 2/1999 | Ripley | |
| 5,880,921 A | 3/1999 | Tham et al. | |
| 5,889,852 A | 3/1999 | Rosecrans et al. | |
| 5,892,486 A | 4/1999 | Cook et al. | |
| 5,908,811 A | 6/1999 | Das | |
| 5,910,994 A | 6/1999 | Lane et al. | |
| 5,945,887 A | 8/1999 | Makino et al. | |
| 5,965,494 A | 10/1999 | Terashima et al. | |
| 5,973,567 A | 10/1999 | Heal et al. | |
| 5,973,568 A | 10/1999 | Shapiro et al. | |
| 5,977,917 A | 11/1999 | Hirose | |
| 5,986,515 A | 11/1999 | Sakurai | |
| 5,987,314 A | 11/1999 | Saito | |
| 5,990,766 A | 11/1999 | Zhan | |
| 6,008,659 A | 12/1999 | Traynor | |
| 6,018,282 A | 1/2000 | Tsuda | |
| 6,020,787 A | 2/2000 | Kim et al. | |
| 6,026,311 A | 2/2000 | Willemsen Cortes et al. | |
| 6,028,561 A | 2/2000 | Takei | |
| 6,049,726 A | 4/2000 | Gruenwald et al. | |
| 6,052,036 A | 4/2000 | Enstrom et al. | |
| 6,054,908 A | 4/2000 | Jackson | |
| 6,084,951 A | 7/2000 | Smith et al. | |
| 6,094,588 A | 7/2000 | Adam | |
| 6,097,263 A | 8/2000 | Mueller et al. | |
| 6,101,102 A | 8/2000 | Brand et al. | |
| 6,108,191 A | 8/2000 | Bruchhaus et al. | |
| 6,160,524 A | 12/2000 | Wilber | |
| 6,181,777 B1 | 1/2001 | Kiko | |
| 6,198,441 B1 | 3/2001 | Okabe et al. | |
| 6,216,020 B1 | 4/2001 | Findikoglu | |
| 6,242,843 B1 | 6/2001 | Pohjonen et al. | |
| 6,272,336 B1 | 8/2001 | Appel et al. | |
| 6,278,383 B1 | 8/2001 | Endo et al. | |
| 6,281,023 B1 | 8/2001 | Eastep et al. | |
| 6,281,534 B1 | 8/2001 | Arita et al. | |
| 6,285,337 B1 | 9/2001 | West et al. | |
| 6,292,143 B1 | 9/2001 | Romanofsky | |
| 6,294,964 B1 | 9/2001 | Satoh | |
| 6,308,051 B1 | 10/2001 | Atokawa | |
| 6,329,959 B1 | 11/2001 | Varadan et al. | |
| 6,327,463 B1 | 12/2001 | Welland | |
| 6,333,719 B1 | 12/2001 | Varadan | |
| 6,335,710 B1 | 1/2002 | Falk et al. | |
| 6,344,823 B1 | 2/2002 | Deng | |
| 6,359,444 B1 | 3/2002 | Grimes | |
| 6,362,690 B1 * | 3/2002 | Tichauer | 330/298 |
| 6,362,784 B1 | 3/2002 | Kane et al. | |
| 6,362,789 B1 | 3/2002 | Trumbull et al. | |
| 6,384,785 B1 | 5/2002 | Kamogawa et al. | |
| 6,404,304 B1 | 6/2002 | Kwon et al. | |
| 6,421,016 B1 | 7/2002 | Philips et al. | |
| 6,456,236 B1 | 9/2002 | Hauck et al. | |
| 6,462,628 B1 | 10/2002 | Kondo et al. | |
| 6,489,860 B1 | 12/2002 | Ohashi | |
| 6,503,786 B1 | 1/2003 | Klodzinski | |
| 6,518,850 B1 | 2/2003 | Falk et al. | |
| 6,518,920 B1 | 2/2003 | Proctor, Jr. et al. | |
| 6,522,220 B1 | 2/2003 | Yamada et al. | |
| 6,525,630 B1 | 2/2003 | Zhu et al. | |
| 6,525,691 B1 | 2/2003 | Varadan et al. | |
| 6,531,936 B1 | 3/2003 | Chiu et al. | |
| 6,559,737 B1 | 5/2003 | Nagra et al. | |
| 6,571,110 B1 | 5/2003 | Patton et al. | |
| 6,600,456 B1 | 7/2003 | Gothard et al. | |
| 6,653,977 B1 | 11/2003 | Okabe et al. | |
| 6,667,723 B1 | 12/2003 | Forrester | |
| 6,686,817 B1 | 2/2004 | Zhu et al. | |
| 6,721,293 B1 | 4/2004 | Komulainen et al. | |
| 6,727,535 B1 | 4/2004 | Sengupta et al. | |
| 6,819,203 B1 | 11/2004 | Taniguchi | |
| 6,842,086 B1 | 1/2005 | Zennamo et al. | |
| 6,873,294 B1 | 5/2005 | Anderson et al. | |
| 6,898,450 B1 | 5/2005 | Eden et al. | |
| 6,985,113 B1 | 1/2006 | Nishimura et al. | |
| 6,987,486 B1 | 1/2006 | Kurjenheimo et al. | |
| 2001/0026243 A1 | 10/2001 | Koitsalu et al. | |
| 2001/0043159 A1 | 11/2001 | Masuda et al. | |
| 2002/0049064 A1 | 4/2002 | Banno | |

| | | | |
|---|---|---|---|
| 2002/0094791 | A1* | 7/2002 | Pehike et al. ............... 455/115 |
| 2002/0149526 | A1 | 10/2002 | Tran et al. |
| 2002/0149535 | A1 | 10/2002 | Toncich |
| 2002/0175878 | A1 | 11/2002 | Toncich |
| 2003/0062971 | A1 | 4/2003 | Toncich |
| 2003/0134665 | A1 | 7/2003 | Kato et al. |
| 2003/0169206 | A1 | 9/2003 | Egawa |
| 2004/0087280 | A1 | 5/2004 | Watanabe et al. |
| 2004/0162047 | A1 | 8/2004 | Kasahara et al. |
| 2004/0196121 | A1 | 10/2004 | Toncich |
| 2004/0204145 | A1 | 10/2004 | Nagatomo |
| 2004/0207722 | A1 | 10/2004 | Koyama et al. |
| 2004/0263411 | A1 | 12/2004 | Fabrega-Sanchez et al. |
| 2005/0007291 | A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 | 2/1995 |
| EP | 0 680 108 | 11/1995 |
| EP | 0 795 922 | 9/1997 |
| EP | 0 854 567 | 7/1998 |
| EP | 0 872 953 | 10/1998 |
| EP | 0 881 700 | 12/1998 |
| EP | 0 892 459 | 1/1999 |
| EP | 0 909 024 | 4/1999 |
| EP | 1 043 741 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001 338839 | 12/2001 |
| WO | WO 82/03510 | 10/1982 |
| WO | WO 94/27376 | 11/1994 |
| WO | WO 00/35042 | 6/2000 |
| WO | WO 00/62367 | 10/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.

Cohn, S.B., "Dissipation Loss in Multiple-Coupled-Resonator Filters," Proc. IRE 47, Aug. 1959, pp. 1342-1348.

Cuthbert, T., "Broadband Impedance Matching—Fast and Simple", RF Design, Cardiff Publishing Co., vol. 17, No. 12, Nov. 1994, pp. 38, 42, 44, 48, XP000477834.

Dishal, M., "Alignment and Adjustment of Synchronously Tuned Multiple Resonator-Circuit Filters," Proc. IRE 39, Nov. 1951, pp. 1448-1455.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Fubini, E.G. et al., "Minimum Insertion Loss Filters," Proc. IRE 47, Jan. 1959, pp. 37-41.

Fujita, K. et al., "A 15.6 GHz Commercially Based 1/8 GaAs Dynamic Presealer," 1989 IEEE GaAs IC Symposium, pp. 113-116, no month.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Getsinger, W.J., "Prototypes for Use in Broadbanding Reflection Amplifiers," IEEE Trans. PTGMTT-11, Nov. 1963, pp. 486-497.

Getsinger, W.J., et al., "Some Aspects of the Design of Wide-Band Up-Converters and Nondegenerate Parametric Amplifiers," IEEE Trans. PTGMTT-12, Jan. 1964, pp. 77-87.

Gevorgian, Spartak S. et al., "HTS/Ferroelectric Devices for Microwave Applications", IEEE Transactions on Applied Superconductivity, Jun. 1997, pp. 2458-2461, IEEE, USA.

Hopf, B. et al., "Coplanar MMIC Active Bandpass Filters Using Negative Resistance Circuits," 1994 IEEE MTT-S Symposium Digest, pp. 1183-1185, no month.

Hunter, I.C. et al., "Electronically Tunable Microwave Bandpass Filters," IEEE Trans. on MTTT, vol. 30, No. 9, Sep. 1982, pp. 1354-1367.

Jose et al., "Experimental investigations on electronically tunable microstrip antennas," Feb. 5, 1999, Microwave and optical technology letters, vol. 20, No. 3, pp. 166-169.

Kapilevich, B., "Understand the Operation of Chanelized Active Filters," Microwaves & RF, Jan. 1997, pp. 89-82.

Kapilevich, B., "Variety of Approaches to Designing Microwave Active Filters," Proc. 27th European Microwave Conference, Jerusalem, vol. 1, 1997, pp. 397-408, no month.

Karacaoglu, U. et al., "High Selectivity Varactor-Tuned MMIC Bandpass Filter Using Lossless Active Resonators," 1994 IEEE MTT-Symposium Digest, pp. 1191-1194, no month.

Katzin, P. et al., "Narrow-band MMIC Filters with Automatic Tuning and Q-Factor Control," 1993 IEEE MTT-S Int. Microwave Symposium Digest, pp. 403-406, no month.

Keis, V. N. et al., "20GHz tunable filter based on ferroelectric (BaSr) TiO3 film varactors", Electronics Letters, May 28, 1998, vol. 34, No. 11, IEE Stevenage, GB.

Kotzebue, K.L., "Broadband Electronically-Tunable Microwave Filters," 1960 IRE Wescon Convention Record, Part 1, pp. 21-27, no month.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA, no month.

Krautkramer, V.W. et al., "Resonanztransformatoren mit drei Reaktanzen als transformierende Filter", Bullentin des Schweizerischen Elektrotechnischen Vereins, Zurich, CH, vol. 64, No. 23, Nov. 10, 1973, pp. 1500-1509, XP002184530.

Kuh, E.S. et al., "Optimum Synthesis of Wide-Band Parametric Amplifiers and Converters," IRE Trans. PCCT-8, Dec. 1961, pp. 410-415.

Louhos, J.P. et al., "Electrical Tuning of Integrated Mobile Phone Antennas," Nokia Mobile Phones, pp. 69-97 (Sep. 15, 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54, no month.

Matthaei, G.L., "An Electronically Tunable Up-Converter," Proc. IRE 49, Nov. 1961, pp. 1703-1704.

Nauta, B., "A CMOS Transconductance-C Filter Technique for Very High Frequencies," IEEE Journal of Solid-State Circuits, vol. 27, No. 2, Feb. 1992, pp. 142-153.

Panayi, P.K. et al., "Tuning Techniques for the Planar Inverted-F Antenna," National Conference on Antennas and Propagation Publication, No. 461, pp. 259-262, (Apr. 1999).

Presser, A., "Varactor-Tunable, High-Q Microwave Filter," RCA Review, vol. 42, Dec. 1981, pp. 691-705.

Steven, R.L., "Design of a Tunable Multi-Cavity Waveguide Band-Pass Filter," 1959 IRE National Convention Record, Part 3, pp. 91-112, no month.

Smuk, J. et al., "MMIC Phase Locked L-S Band Oscillators," 1994 IEEE GaAs Symposium Digest, pp. 27-29, no month.

Taub, J.J. et al., "Design of Three-Resonator Dissipative Band-Pass Filters Having Minimum Insertion Loss," Proc. IRE 45, pp. 681-687 (May 1957).

Toncich et al., "Data Reduction Method for Q Measurements of Stripline Resonators", IEEE Transactions in MTT, vol. 40, No. 9, Sep. 1992, pp. 1833-1836.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Varadan, V.K. et al., "Design and Development of Electronically Tunable Microstrip Antennas," IOP Publishing Ltd., pp. 238-242, (1999), no month.

Vendik, O.G. et al., "1GHz tunable resonator on bulk single crystal SrTiO3 plated with Yba2Cu3O7-x films", Electronics Letters, Apr. 13, 1995, pp. 654-656, vol. 31, No. 8, IEEE Stevenage, GB.

* cited by examiner

SYSTEMS AND METHODS FOR CONTROLLING OUTPUT POWER IN A COMMUNICATION DEVICE

This application is a Continuation-in-part of patent application Ser. No. 10/035,596 filed Oct. 22, 2001 is now U.S. Pat. No. 6,710,651 and hereby incorporated by reference.

BACKGROUND OF THE INVENTION

1. Field of the Invention

The invention relates generally to wireless communication and more particularly to systems and methods for controlling the output power in a wireless communication device.

2. Background

There are several factors that impact the transmit power level in the transmitter of a wireless communication device. Two factors that limit the transmit power level, for example, are: 1) Specific Absorption Rate (SAR) requirements; and 2) Adjacent Channel Power Ratio (ACPR) requirements. SAR is a metric used to evaluate compliance of portable devices with the maximum permissible exposure limits as defined in the FCC guidelines on human exposure to Radio Frequency (RF) emissions. Effectively, the FCC guidelines place a limit on the maximum transmit power of a" " communication device in order to prevent exposure by users of such devices to excessive levels of RF energy.

ACPR is generally defined as the ratio of the average power in the adjacent frequency channel to the average power in the transmitted frequency channel. In other words, a wireless communication device is configured to transmit over a specific frequency channel at any given time. But due to inherent linearity and other limitations of the components that comprise a communication device transmitter, it is very difficult to prevent the energy transmitted by the device from spreading over into adjacent channels. If too much energy resides in the adjacent channels, then it can interfere with devices operating on those channels. Therefore, many wireless communication standards define limits for ACPR, and even when the applicable standard does not define a limit, ACPR is still a practical limitation.

In order to maintain acceptable SAR and ACPR limits, conventional communication device transmitters typically comprise a power detector, to detect the transmit power level, and an isolator to isolate the transmitter from reflected energy generated at the interface between the transmitter and the device's antenna. For example, in a Frequency Modulation (FM) transmitter, SAR is the limiting issue. Therefore, a power detector can be used to ensure that the output power of the transmitter does not exceed the FCC specified limits. In a transmitter that is implementing a complex modulation scheme, such as Code Division Multiple Access (CDMA) or Time Division Multiple Access (TDMA), on the other hand, there are much more stringent linearity requirements. Thus, ACPR is the limiting issue, although SAR still applies. If too much power is reflected back into the transmitter, the linearity and, therefore, the ACPR can be substantially degraded. Accordingly, conventional devices often insert an isolator to block the reflected power.

While the conventional detector/isolator approach has certain advantages, it also has certain limitations that can substantially impact the performance of a wireless communication device. For example, the impedance of the transmission line that conveys the transmitted power to the antenna is designed to match the impedance of the antenna in order to reduce the amount of reflected energy and increase transmission efficiency. But when the communication device is placed next to the human head, for example, the impedance of the antenna changes due to the proximity with the head. As a result, more power is reflected back toward the transmitter. When this reflected energy reaches the isolator it is dissipated as heat. Therefore, the resulting radiated transmit power is much lower than it otherwise could be, even taking into account the SAR limitation.

Additionally, the isolator introduces extra loss into the transmission path that is typically on the order of 0.5 dB. Therefore, the transmitter must supply an extra 0.5 dB of power in order to compensate for the extra loss. Increasing the power, however, also increases the ACPR, i.e., increases the amount of energy in the adjacent channels. Because ACPR is predominantly a 3rd order product, the resulting increase in ACPR is approximately 3 times the increase in transmit power, or 1.5 dB, which can lead to non-compliance with the ACPR requirements. Thus, as can be seen, the conventional detector/isolator approach can have a substantial negative impact on the performance of a wireless communication device.

FIG. 21 illustrates an exemplary wireless communication transceiver 100. Such a transceiver can be included in a wireless communication device, thus enabling the device to communicate over a wireless communication channel 124 in a wireless communication system. Transceiver 100 actually comprises a receive path 106 and a transmit path 110. Preferably, both paths are interfaced with antenna 102 via a duplexer 108. Duplexer 108 essentially acts as a filter that is configured to shunt incoming RF signals received by antenna 102 to receive path 106. Duplexer 108 is further configured to send outgoing RF signals from transmit path 110 to antenna 102, while providing isolation between paths 106 and 110 so that the incoming and outgoing signals do not interfere with each other.

The received RF signals are then demodulated and processed so as to extract a baseband information signal in the receive portion of transceiver 100 (not shown). Preferably, the baseband information signal is then decoded and processed in a baseband processor (not shown), such as a Mobile Station Modem (MSM). The MSM, or equivalent, is also preferably responsible for generating and encoding baseband information signals that are to be transmitted over communication channel 124. The baseband information signals generated by the MSM (not shown) are then modulated with a RF carrier in the transmit portion of transceiver 100, which generates a RF transmit signal to be transmitted via antenna 102.

The transmit portion of transceiver 100 is also preferably configured to set the power level of the RF transmit signal. In general, Power Amplifier (PA) 120 in conjunction with Variable Gain Amplifier (VGA) 122 generate the required power level as demanded by the MSM. PAs are typically key components in any high frequency RF transmitter design. This is because RF transmitters typically require high output power to compensate for path losses in communication channel 124 and to ensure an adequate signal strength at the base station associated with channel 124. Since the base station can be miles away, it can be difficult to achieve adequate receive power at the base station. At the same time, if the signal power at the base station is too high, then it may interfere with reception by the base station of transmit signals from other devices within the communication system. Transmitting at higher power levels also reduces battery operating time. Therefore, while it is important to ensure an adequate transmit power level, it is also important to ensure that the transmit power level is not too high. Thus, power control in a wireless communication device is an important aspect of wireless communication.

In conventional wireless communication systems, power control is often performed in the wireless communication device. For example, the base station can be configured to measure the power level of a received transmit signal and determine if it is too high or too low. The base station can then be configured to transmit commands to the wireless communication device instructing the device to turn its power up or down. CDMA communication systems, for example, use such a power control loop. In a CDMA system, the goal of the base stations is to receive signals from each of the devices with which it is communicating at the same receive power level. In fact, such power equalization at the base station for each of the devices in communication with the base station is a critical aspect of CDMA operation. Thus, power control is a critical component of device operation in a CDMA system, although it is similarly important in many types of wireless communication systems.

For illustrative purposes, the power control loop operation for a CDMA system is described in the following paragraphs in conjunction with the flow chart of FIG. 22. The process of FIG. 22 is intended to illustrate the need for power control and the role it plays in wireless communication. It should not, however, be seen as limiting the systems and methods described herein to any particular type of power control, or any particular power control approach. Nor should it be seen as limiting the systems and methods described herein to any particular type of wireless communication system.

Again, in a CDMA system, such as an IS-95 compliant system, the transmit power is controlled in the communication device so that devices communicating with the same base station appear to have the same signal strength at the base station. In each device, the transmit power is variable to compensate for changes in the signal strength as received by the base station. The signal strength at the base station can vary due to changing distances between a communication device and the base station and such factors effecting communication channel 124 as multipath fading, varying terrain topology, and varying environmental conditions.

Referring to FIG. 22, the power control loop in a CDMA system, begins by entering an open loop power control sequence 234 in step 202. Once in open loop sequence 234, the device will estimate an initial transmit power in step 204. For example, the initial estimate can be made using a predetermined loop power equation such as the following equation:

$$Rx \text{ power} + Tx \text{ power} = -73 \text{ dBm}. \quad (1)$$

In equation (1), Rx power is the signal strength of a RF signal received from the bases station over communication channel 124 by antenna 102. Once this received power level is determined, e.g., via a Received Signal Strength Indication (RSSI) measurement, then it can be used by loop equation (1) to determine the initial transmit power, or Tx power, in step 204. The device will then transmit a signal at this initial power level to the base station in step 206 and wait for an acknowledgement from the base station in step 210. If the device does not receive an acknowledgement in step 212, then it will increase the transmit power in step 214, transmit again in step 216, and again wait for acknowledgement (step 210). Typically, a device may need to increase its power 1 or 2 times before receiving the acknowledgement.

The open loop process is a coarse estimate of the required transmit power. Thus a tolerance of +/−9 db is, for example, allowed on the open loop estimate of the required power.

Once the device receives an acknowledgement (step 212), however, it enters, in step 218, a closed loop power sequence 236 in which the transmit power level estimate is refined. The goal of closed loop power control sequence 236 is to ensure that the power received at the base station is the minimum level of power required for each device with which the base station is communicating.

Once in closed loop sequence 236, the base station measures the received power-to-interference-ratio (Eb/Io) and compares the measured value to a minimum and a maximum threshold in step 222. If the base station determines that the measured Eb/Io is above the maximum threshold in step 224, then, in step 226, it sends a command to the device to reduce its power. If, on the other hand, the base station determines in step 228 that the Eb/Io is below the minimum threshold, then it sends a command to the device to raise its transmit power level in step 230. Of course, the measured Eb/Io may be between the minimum and maximum thresholds in which case there would be no need for the device to modify its power. In such a situation, the device can be instructed to maintain the same transmit power level in step 232. The measurement (step 220) and comparison (222) is preferably repeated periodically, e.g., every 1.25 ms, or 800 times per second. Thus, it can be seen that power control plays an important role in proper operation of a communication device within a wireless communication system.

Referring again to FIG. 21, there are several ways that a device can control the output power in transceiver 100. Because the transmit power may have to be varied over a large range typically in excess of 70 dB, one way to control the output power is by varying the gain of VGA 122. Further to ensure improved transmitter efficiency at lower power levels, PA bias 126 may also be adjusted as required. VGA 122 can be configured to amplify the transmit signal before it is sent to PA 120. How much VGA 122 amplifies the transmit signal can be controlled via a TX POWER CONTROL signal 128, which can be generated by an MSM (not shown) or some other baseband control circuit (not shown).

Proper control of the transmit power level, as explained above, can be critical for efficient operation of a wireless communication device in a wireless communication system. There are other limits, however, on the transmit power level in transceiver 100. For example, as explained above, SAR limitations may restrict the transmit power level regardless of what the power control loop operation may dictate. To ensure that the SAR limitations are not exceeded, conventional wireless communication devices typically employ some sort of power detector 114. In transceiver 100, power detector 114 comprises a diode 118. The output 130 of detector 114 is then sent to a MSM (not shown) or some other baseband control circuit (not shown).

The analog voltage generated by the detector 114 represents the generated transmit power level and can be converted to a digital number, by means of an analog-to-digital converter for example, such that the MSM (not shown) can adjust the gain of VGA 122 accordingly to meet the desired transmit power level. Notably, however, such a power detection scheme does not take into account reflected power that is dissipated in isolator 112. Isolator 112 is included because the reflected power can have an adverse effect, e.g., increased ACPR especially at high transmit power levels, if it is allowed to interact with the transmit signal being generated by PA 120.

Reflected power occurs because of mismatches in the impedance between the transmission line 132 conveying the transmit signal and antenna 102. The amount of reflected power is determined by the reflection coefficient, which is a measure of the mismatch in impedance between antenna 102 and transmission line 132. To lower the reflection coefficient, and thereby reduce the amount of reflected power, conventional devices typically include matching circuit 104. The purpose of matching circuit 104 is to match the impedance of transmission line 132 with that of antenna 102. In practice, however, it is very difficult to achieve a perfect match. Therefore, some of the transmit power is reflected back toward PA 120. The reflected power generates a standing wave on transmission line 132 from the interaction between the forward and reflected signals. Voltage Standing Wave Ratio (VSWR) is a metric used to determine how much of the transmitted power is making it out at antenna 102. VSWR can be defined by the following equation:

$$VSWR = (Vfwd + Vref)/(Vfwd - Vref). \quad (2)$$

In equation (2), Vfwd is a measure of the voltage level of the transmit signal on transmission line 132 and Vref is a measure of the voltage level of the reflected signal. If impedance matching circuit 104 provides a perfect match, then the ratio is 1:1 and maximum power will be delivered to antenna 102. Any deviation from this condition, i.e., a VSWR greater than 1:1, and less than maximum power is delivered to antenna 102.

If it were not for isolator 112, the reflected power would travel back toward PA 120, reflect again, and travel back toward antenna 102. Therefore, at least some portion of the reflected power would eventually get out at antenna 102. Thus, a transceiver can be designed for a VSWR of approximately 2:1 and still have sufficient performance. But in transceiver 102, the reflected power is actually dissipated in isolator 112 as heat. Thus, any deviation from a VSWR of 1:1 results in wasted transmit power and reduced talk time. But detector 114 does not take into account the effect of isolator 112 and, as a result, transceiver 100 can actually be operating well below SAR limits when the device is limiting the PA output due to the measurements from detector 114.

For example, it is not uncommon for the VSWR to degrade from 2:1 to approximately 3:1 when a wireless communication device is placed next to a human head during operation. A VSWR of 3:1, however, means that 25% of the transmit power is reflected back into the device, where it is dissipated as heat in isolator 112. Because this power is wasted, the power level is much lower than expected. This not only results in inefficient operation of transceiver 100, but can actually cause the device to lose its connection with the base station. Even if detector 114 is not causing the transmit power level to be limited, PA 120 must operate at excessive power levels in order to compensate for the transmit power wasted in isolator 112, which not only reduces battery capacity but can also raise ACPR.

As mentioned above, isolator 112 also typically adds approximately 0.5 dB of loss to the transmission path, which requires PA 120 to increase the transmit power level to compensate. Not only does this result in inefficient operation of PA 120 and reduces battery life among other things, but it also causes the ACPR to increase. Because ACPR is a 3rd order product, a 0.5 dB increase in transmit power will result in approximately a 1.5 dB increase in ACPR, which may cause excessive interference in the adjacent channel.

In view of the above discussion, it can be seen that the use of detector 114 and isolator 112 can have a substantial negative impact on the performance of transceiver 100.

SUMMARY OF THE INVENTION

Thus, it is an objective of the invention to eliminate the need for an isolator in the transmitter of a wireless communication device. It is a further objective to provide dynamic control of the transmit power level in the transmitter in order to maintain maximum output power, while still meeting such limitations as SAR and ACPR. In one aspect of the invention, the systems and methods for controlling output power in a communication device use a power control circuit to sense both the forward and reflected power levels in the transmission path between the transmitter and the antenna. The power control circuit is then configured to control the transmit power level of the transmitter based on the power levels that it senses.

For example, in one particular implementation the transmitter power level can be optimally controlled by adjusting a Power Amplifier (PA) drive signal in accordance with inputs from a MSM, such as a demanded transmit power input, and by forward/reverse powers detected by the power control circuit. For example in an extreme case where forward and reflected powers are identical (100% power reflection), an embodiment would reduce drive power to the PA to a very low level and avoid the condition of dissipating excess power as heat. Further the power control system would adjust the PA bias to the most appropriate point for a given output level. For higher power levels where high linearity is required the bias would be increased. For lower power levels the bias point would be decreased, but not to a point where ACPR is impacted.

In another embodiment the power control circuit may also adjust an impedance matching circuit based at least in part on the reflected power level sensed by the bi-directional coupler detector.

These embodiments as well as other features, advantages, and embodiments are described below in conjunction with the following drawings.

BRIEF DESCRIPTION OF THE DRAWINGS

Preferred embodiments of the present inventions taught herein are illustrated by way of example, and not by way of limitation, in the figures of the accompanying drawings, in which.

Use of the same reference symbols in different figures indicates similar or identical items.

DETAILED DESCRIPTION OF THE PREFERRED EMBODIMENTS

Figure 1:
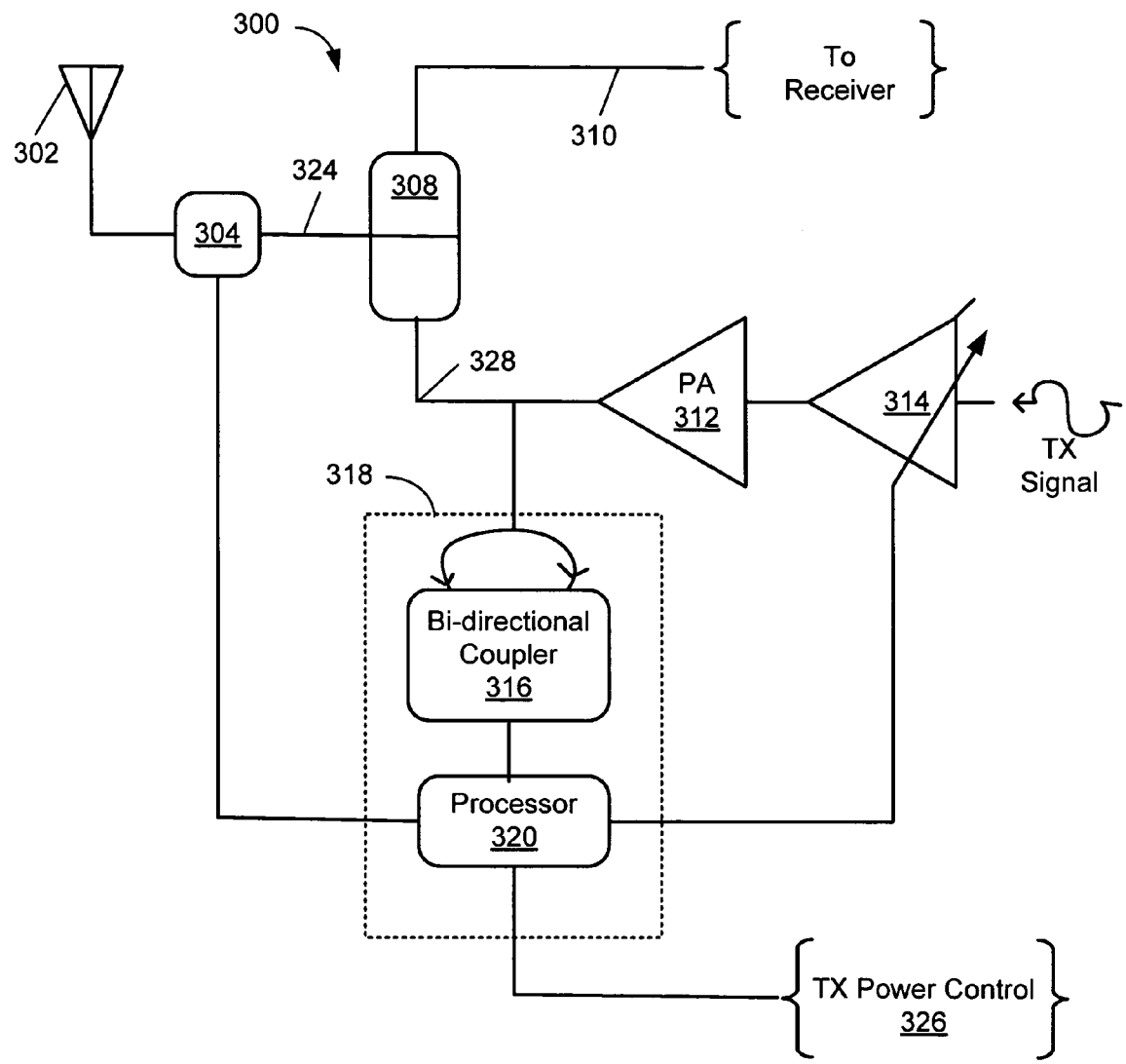
FIG. 1 is a logical block diagram illustrating an example embodiment of a wireless communication transceiver in accordance with the invention.

FIG. 1 illustrates an example embodiment of a transceiver 300 designed in accordance with the systems and methods described herein. As can be seen, transceiver 300 can comprise an antenna 302, matching circuit 304, duplexer 308, receive path 310, transmit path 328, PA 312, and VGA 314, which operate in substantially the same manner as described in relation to the similar components of transceiver 100. Instead of isolator 112, however, transceiver 300 includes power control circuit 318, which preferably comprises bi-directional coupler detector 316 and a processor 320. Processor 320 can be a DSP, microcontroller, microprocessor, or any other type of controller capable implementing the systems and methods as described herein.

Bi-directional coupler detector 316 is configured to sense both the forward and reflected power levels on transmission line 324. By comparing these two power levels, power control circuit 318 can accurately determine the actual amount of transmit power reaching antenna 302 and sent over communication channel 124. Thus, the transmit power level can be more accurately controlled in order to meet a variety of limitations and/or design criteria, such as SAR, power consumption (battery life), and base station receive power level requirements. Moreover, the reflected power can be monitored to ensure that it remains below an absolute predetermined level in order to avoid excessive ACPR. If the reflected power exceeds the absolute predetermined level, power control circuit 318 can be configured to cause the transmit power level to be reduced in order to bring the reflected power level and, therefore, the ACPR level down to an acceptable level.

Preferably, processor 320 is configured to control the transmit power level in the same ways described above. Thus, processor 320 is preferably interfaced with VGA 312 in such a manner as to be able to modify the gain of the VGA 314, which is preferably initially set in accordance with instruction from the MSM (not shown).

By eliminating isolator 112, significant savings can be recognized in the construction of transceiver 300 including savings in cost, component count, and board area. Moreover, power control circuit 318 helps to provide greater control over the transmit power level, which results in better performance, reduced power consumption, and increased battery life.

Figure 2:
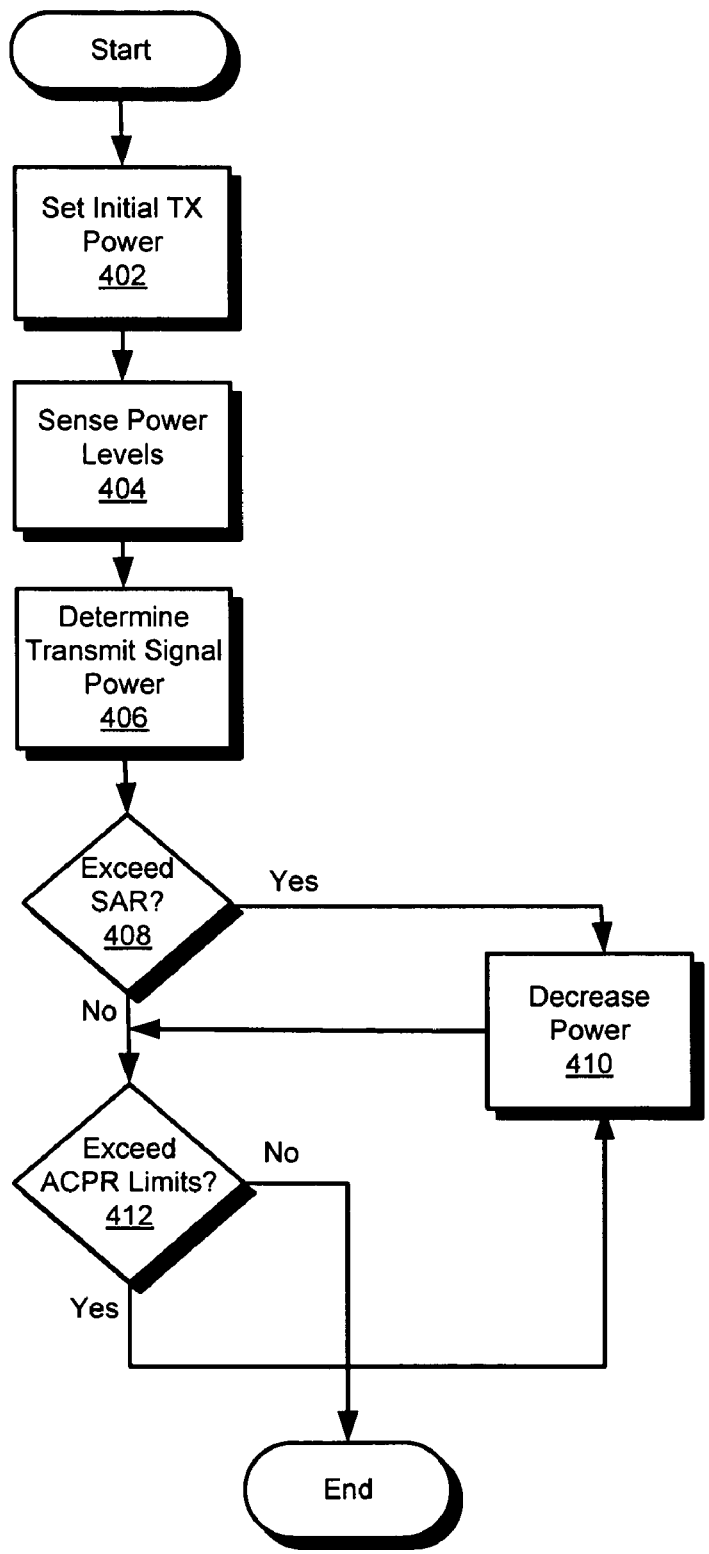
FIG. 2 is flow chart illustrating an example embodiment of a process for controlling the transmit power level in the wireless transceiver of FIG. 1 in accordance with the invention.

FIG. 2 is a flow chart illustrating an example method whereby power control circuit 318 can control VGA 314 and PA 312 in order to control the transmit power level in a transceiver such as transceiver 300. First, in step 402, the power control circuit 318 can receive a control signal instructing that the gain of VGA 314 be set to a predetermined level. For example, power control circuit 318 can be instructed to set the gain such that the transmit power level is equal to an initial power level as determined using equation (1) or an equivalent equation. Alternatively, the initial gain can be set by the MSM (not shown) or other baseband control circuit (not shown).

Next, in step 404, bi-directional coupler detector 316 senses the forward and reverse power levels on transmission line 324. Then in step 406, power control circuit 318 accurately determines the amount of transmit signal power reaching antenna 302 and actually being radiated by comparing the forward and reverse power levels. If the power level reaching antenna 302 and being radiated exceeds the SAR limitations as determined in step 408, then in step 410 the power control circuit 318 can decrease the transmit power level by varying the gain of VGA 314, for example. Alternatively, power control circuit 318 can be interfaced with the MSM (not shown), or other baseband control circuit (not shown), configured to control the gain. Thus, after making the determination in step 408, power control circuit 318 can cause the MSM (not shown) or baseband control circuit (not shown) to reduce the transmit power level.

In step 408, bi-directional coupler detector 316 determines if the reflected power level is excessive enough to raise the ACPR to an unacceptable level. If it is, then the process again goes to step 410 and the transmit power level is reduced.

Power control circuit 318 can be implemented in hardware or software. Preferably, however, the power control circuit 318 comprises a processor, e.g., processor 320, to executing software/firmware instructions in such a manner as to perform the steps described in the above paragraphs. This allows flexibility to reprogram power control circuit 318, which can be useful in the face of varying SAR or ACPR requirements, for example.

Figure 3:
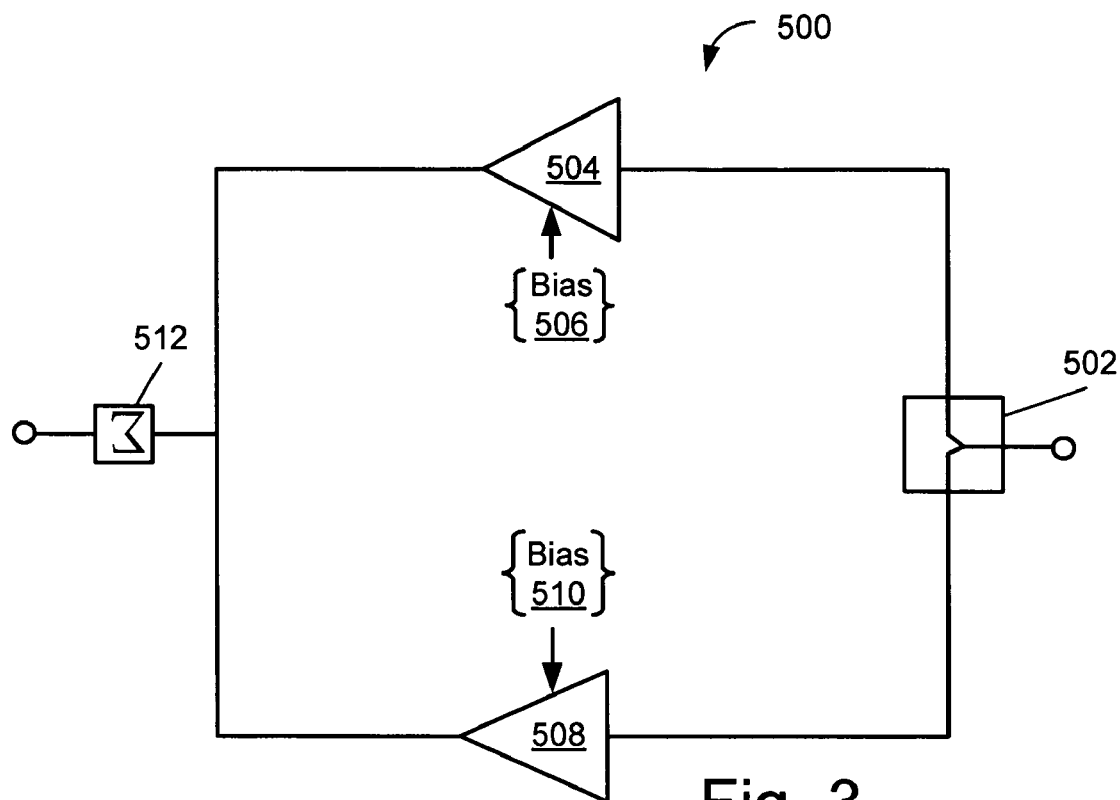
FIG. 3 is a logical block diagram illustrating an exemplary power amplifier for use in the transceiver of FIG. 1.

A push-pull PA design can be used for PA 312 to further reduce ACPR and enhance power conservation within transceiver 300. FIG. 3 illustrates an example push-pull PA 500 that can be used in transceiver 300. PA 500 comprises an in-phase path and an out-of-phase path, which originate at splitter 502. Splitter 502 receives a transmit signal and sends an in-phase signal to amplifier 504, which is supplied by BIAS 506. Splitter 502 also sends an out-of-phase signal to amplifier 508, supplied by BIAS 510. The out-of-phase signal is 180° out of phase with the in-phase signal. After amplification in amplifiers 504 and 508, respectively, the two signals are then balanced and combined in combiner 512.

The transmit power level can be controlled by varying the amplifier biases BIAS 506 and BIAS 510, respectively. The total transmit power level is the combination of the power levels of the signals in both the in-phase and out-of-phase signal paths. Thus, one advantage of PA 500 is that one or the other of amplifiers 504 and 508 can be completely shut off when the total transmit power requirement is low. This can be accomplished, for example, by simply removing the appropriate bias signal. Thus the overall efficiency at low powers is greatly improved.

In another embodiment, the power control circuit 318 can be configured to control the impedance of matching circuit 304 in order to reduce the amount of reflected power. This capability allows the power control circuit 318 further means of lowering the ACPR and ensuring more efficient operation of transceiver 300. Thus, for example, the actual impedance presented by antenna 302 can change as the communication device is brought near the human head, for example. The change in impedance increases the amount of reflected energy and increases the VSWR. In transceiver 300, the increased amount of reflected power will also increase ACPR, since there is no isolator to prevent the reflected power from mixing with the transmit signal. To prevent this from occurring, power control circuit 318 can be configured to modify the impedance of matching circuit 304 so as to provide a better match and reduce the amount of reflected power.

In one implementation, the power control circuit 318 can be configured to control the impedance of matching circuit 304 by switching in and out more or less impedance. A matching circuit 304 typically comprises various inductive and capacitive components in various configurations. Thus, for example, the power control circuit 318 can be configured to switch in and out inductive and/or capacitive components to alter the impedance of matching circuit 304.

Figure 4:
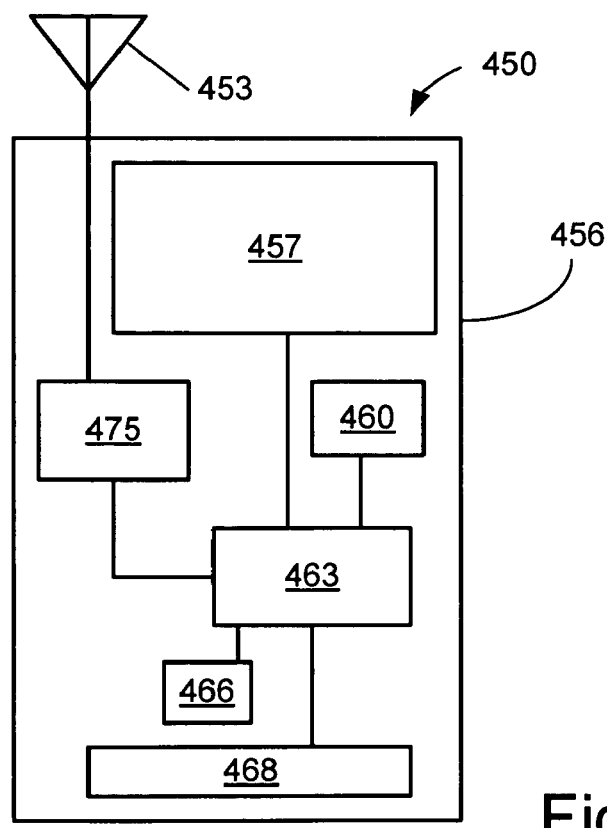
FIG. 4 is a wireless communication device.

Referring now to FIG. 4 a wireless communication device 450 will be discussed. The wireless communication device 450 includes an antenna 453. The antenna 453 is coupled to a transceiver 475. The transceiver 475 includes a transmitter for transmitting electromagnetic signals using the antenna 453 and a receiver for receiving electromagnetic signals using the antenna. The transceiver 475 may be coupled to the antenna through a matching circuit, not shown. It will be clear to those of skill in the art that the antenna may be one or more antennas, for example, the antenna may be an array of antennas, the array capable of transmitting and receiving electromagnetic signals. Alternatively, the antenna may include separate transmit and receive antennas, or separate transmit and receive antenna arrays.

In some cases, the transceiver 475 may be replaced by a receiver. In these cases, the device may typically be referred to as a receive only wireless communication device. In many cases the antenna on a receive only wireless communication device may be optimized to receive electromagnetic signals. This, however, may not always be the case. In some cases the receive only wireless communication device may be optimized to receive electromagnetic signals in a specific frequency range or ranges.

In some cases, the transceiver 475 may be replaced by a transmitter. In these cases, the device may typically, be referred to as a transmit only wireless communication device. In many cases the antenna o7n a transmit only wireless communication device may be optimized to transmit electromagnetic signals. This, however, may not always be the case. In some cases the transmit only wireless communication device may be optimized to transmit electromagnetic signals in a specific frequency range or ranges.

The transceiver 475 is coupled to a control block 463. The control block may be a processor, microprocessor, digital signal processor (DSP), or microcontroler. Additionally, the control block 463 may be a mobile station monitor (MSM). The control block 463 may include multiple processors, and the multiple processors may be different types of processors. For example, a DSP and a microprocessor may both be included in the control block 463. Typically, the DSP would perform digital signal processing tasks, while the microprocessor would perform other tasks.

The control block 463 may also include logic, programmable logic devices, discrete components, or integrated components. The control block 463 may include a processor executing software. Alternatively, the control block may include a logic device or devices configured to perform the control block function. A combination of processor or processors executing software and logic a device or devices performing control block functions is also possible.

The control block 463 is typically coupled to a memory 460. However, in some cases, for example when the control block is not a processor, the memory may not be necessary. Alternatively, the memory may be built into the control block component. It will be clear to those of skill in the art that several of the functional blocks presented may be performed in a signal hardware component. It will also be clear as components become smaller and more integrated, additional functionality may be added.

The control block 463 is typically coupled to an output device 457. The output device may be a screen. Alternatively, the output device may be a speaker, a ringer, a vibrate alert device, or a printer. Other output devices are possible. The wireless communication device 450 may include multiple output devices. For example, mobile phones, a type of wireless communication device typically include a screen, a speaker, and a ringer. Many typically include a vibrate alert device.

The control block may also be connected to an input device 466. The input device 466 may be a keypad, a microphone, or a touch pad. Many different input devices are possible. Typically, a mobile phone, for example, includes a keypad and a microphone.

A power source 468 is coupled to the control block 463. In mobile wireless communication device, the power source will typically be a mobile power source. Typically, the mobile power source would be a battery. Other mobile power sources are also possible. For example, the mobile power source may be a fuel cell or a combination of a battery and a fuel cell. Additionally, the mobile power source may be a solar cell. Again, the mobile power source may be a combination of power sources, for example, solar cell and battery, or solar cell and fuel cell, or possibly all three. The power source is shown powering the control block 463. Typically, the power source 468 would supply power to other components as well, such as, for example, the transceiver 475, the output device 457, the input device 466, and the memory 460. Other configurations are possible. For example, the wireless communication device 450 may have different power sources for each component or group of components.

The wireless communication device 450 is shown enclosed in a case 456. The antenna 453 is shown predominantly external to the case 456. It is however, possible that the antenna 453 could be included internal to the case. Alternatively, in a multiple antenna wireless communication device, as the wireless communication device 450 might be, some group of antennas may be external, while another group of antennas may be internal, including groups as small as a single antenna external, and a single antenna internal. Groups without equal numbers of external and internal antennas are possible.

Impedance matching using fixed valued inductive components and capacitors is difficult to achieve and highly application specific. Therefore, only a limited amount of impedance control can practically be achieved in the manner described with respect to FIG. 3. In another implementation, however, the matching circuit 304 of FIG. 1 can comprise a ferro-electric tunable inductive components and capacitors, the impedance of which can be much more easily controlled to provide dynamic impedance matching for transceiver 300 of FIG. 1. Systems and methods for controlling the impedance of a ferro-electric tunable matching circuit are described more fully in U.S. patent application Ser. No. 09/927,136, entitled "Tunable Matching Circuit," filed Aug. 10, 2001, which is fully incorporated herein by reference. Thus, by using the systems and methods described in U.S. patent application Ser. No. 09/927,136 the advantages of the systems and methods described herein are even further enhanced and extended.

Figure 5:
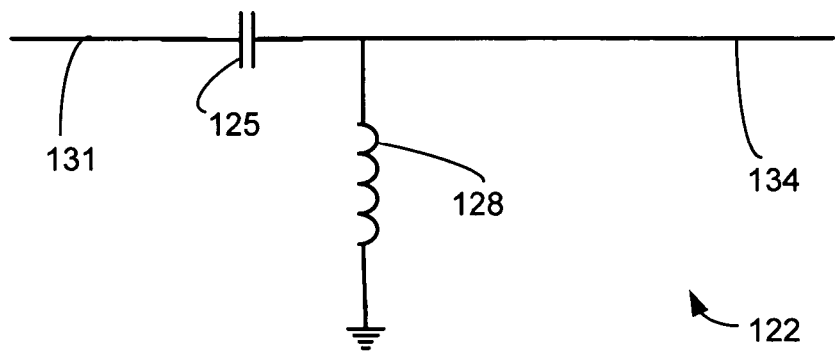
FIG. 5 is a schematic of an exemplary matching circuit.
Figure 6:
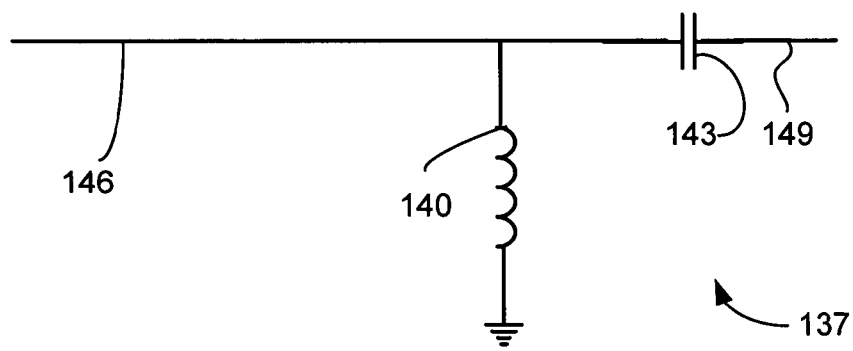
FIG. 6 is a schematic of an exemplary matching circuit.
Figure 7:
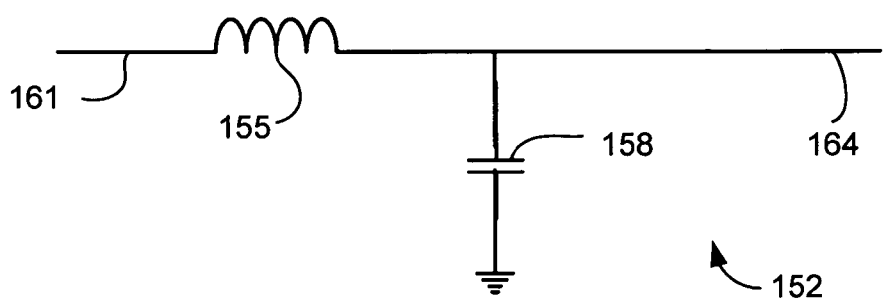
FIG. 7 is a schematic of an exemplary matching circuit.
Figure 8:
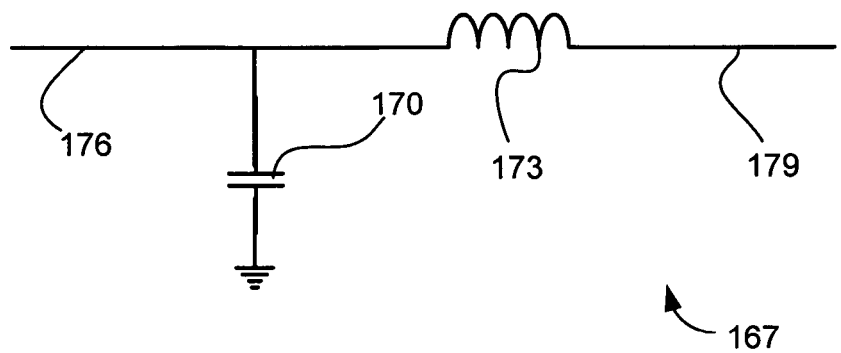
FIG. 8 is a schematic of an exemplary matching circuit.

The matching circuit 304 may be of any topology that is known in the art. Several tunable matching circuits will now be described. With reference to FIG. 5, a tunable matching circuit 122 is shown with a series tunable capacitor 125 and a shunt inductor 128 coupled between an input 131 and an output 134. FIG. 6 shows a tunable matching circuit 137 with a shunt inductor 140 and a series capacitor 143 coupled between an input 146 and an output 149. FIG. 7 shows a tunable matching circuit 152 with a series inductor 155 and a shunt capacitor 158 coupled between an input 161 and an output 164. FIG. 8 shows a tunable matching circuit 167 with a shunt capacitor 170 and a series inductor 173 coupled between an input 176 and an output 179. Alternatively, in any of FIGS. 5–8, the inductor 128, 140, 155, 173 may be tunable, or both the capacitor 125, 143, 158, 170 and inductor 128, 140, 155, 173 may be tunable. Control voltages can be applied to the f-e capacitor by means of the inductors shown in FIGS. 5–8 in many cases. Alternatively, it may be applied to the f-e capacitor by itself by proper design of the capacitor.

Figure 9:
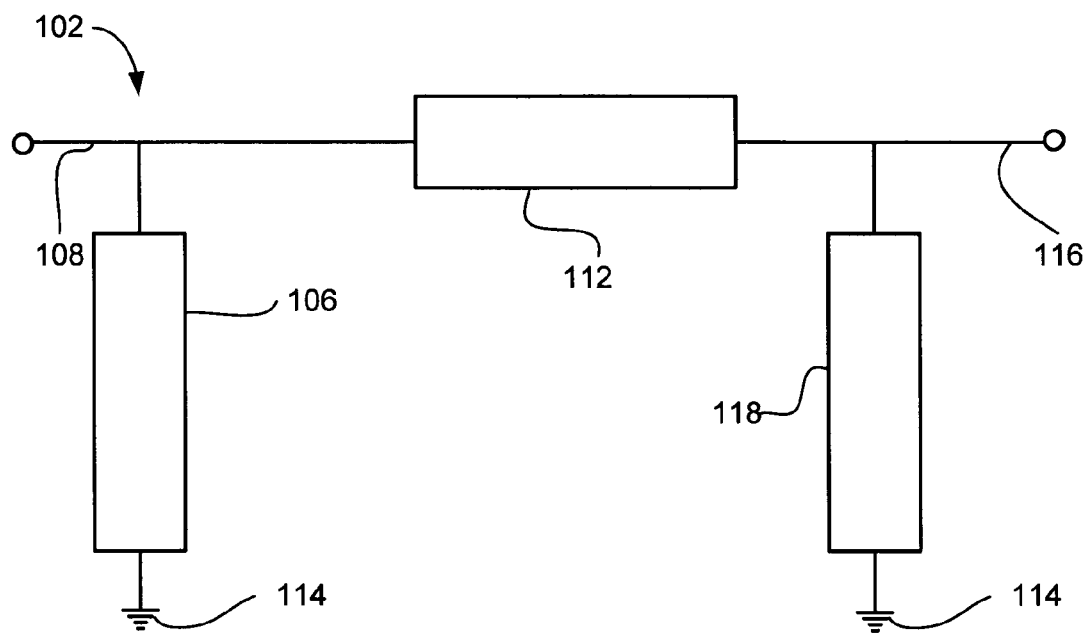
FIG. 9 is a schematic of an exemplary matching circuit.
Figure 10:
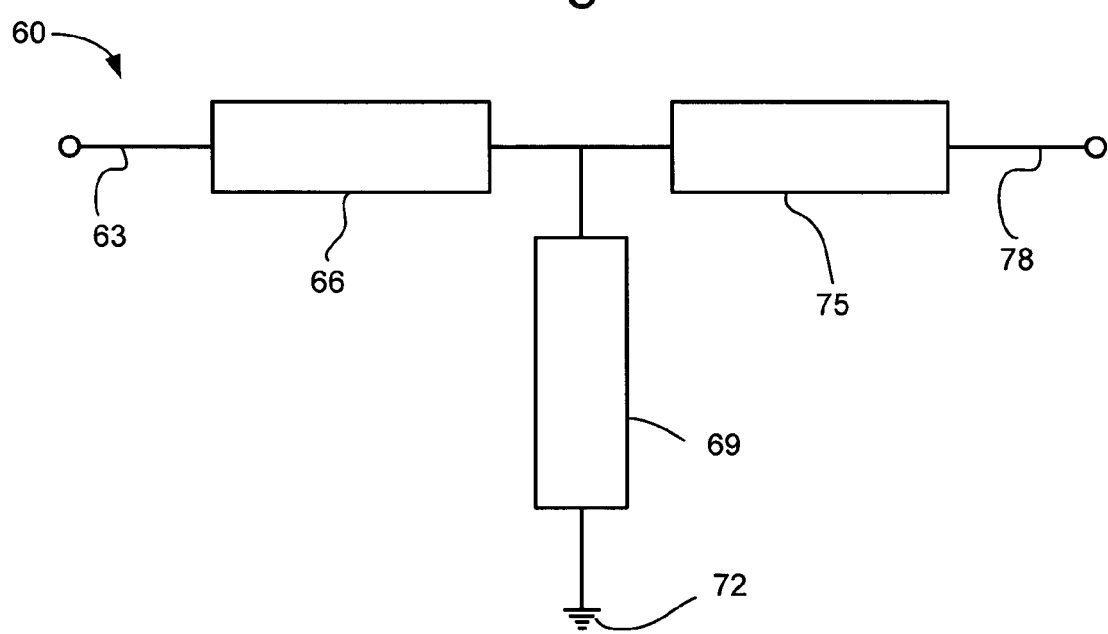
FIG. 10 is a schematic of an exemplary matching circuit.

FIGS. 9 and 10 show more complex matching circuits. FIG. 9 is a block diagram of a pi matching circuit 102. The pi matching circuit 102 has a first reactive element 106 coupled between an input 108 and ground 114. A second reactive element 112 is coupled between the input 108 and an output 116. A third reactive element 118 is coupled between the output 116 and ground 114. Each reactive element 106, 112, 118 may comprise either an inductor or a capacitor. Any or all of the reactive elements may be realized as lumped or distributed elements. At least one of the reactive elements 106, 112, 118 is tunable. This allows for the matching circuit 102 to be tunable.

FIG. 10 is a block diagram of a T matching circuit 60. The T matching circuit 60 has a first reactive element 66 coupled between an input 63 and a second reactive element 69. The second reactive element 69 is coupled between the first reactive element 66 and ground 72. A third reactive element 75 is coupled between the first and second reactive elements 66, 69 and an output 78. Each reactive element 66, 69, 75 may comprise either an inductor or a capacitor. Any or all of the elements shown can be lumped or distributed elements. At least one of the reactive elements 66, 69, 75 is tunable. This allows for the matching circuit 60 to be tunable.

FIGS. 5–10 show representative tunable matching circuits. It will be understood that more complex matching circuits may be constructed by combining the matching circuits shown in FIGS. 5–10 and by adding components in series and in parallel with those components shown.

The capacitance of a f-e capacitor will always decrease with increasing DC (control) voltage. The optimal topology for a matching network must take this into account. A Smith Chart is a useful tool for this purpose. Historically, a Smith Chart was a graphical aid in which a designer could plot the source or load impedance and then choose a matching circuit topology to move the source or load impedance to a desired location, typically to 50Ω.

Alternatively, the f-e material's temperature dependence can be controlled by means of varying the DC control voltage as a function of temperature. One way this can be done is by means of a look-up-table stored in memory along with a temperature sensor, like a diode or thermistor.

F-E temperature dependence can be reduced by appropriate f-e material fabrication as well. In the preferred paraelectric state the material's Curie Temperature is below the operating temperature range. By moving the Curie point lower in temperature, one can achieve less temperature variation in the f-e material. This comes at the expense of less tunability.

The graphical Smith Chart has been implemented on many circuit simulation software packages in wide spread use. Examples are Eagleware (which has a separate matching program as well) and Momentum. These tools can be used to choose the optimum or desirable matching circuit topology and the number of matching elements needed for a given application.

Figure 11:
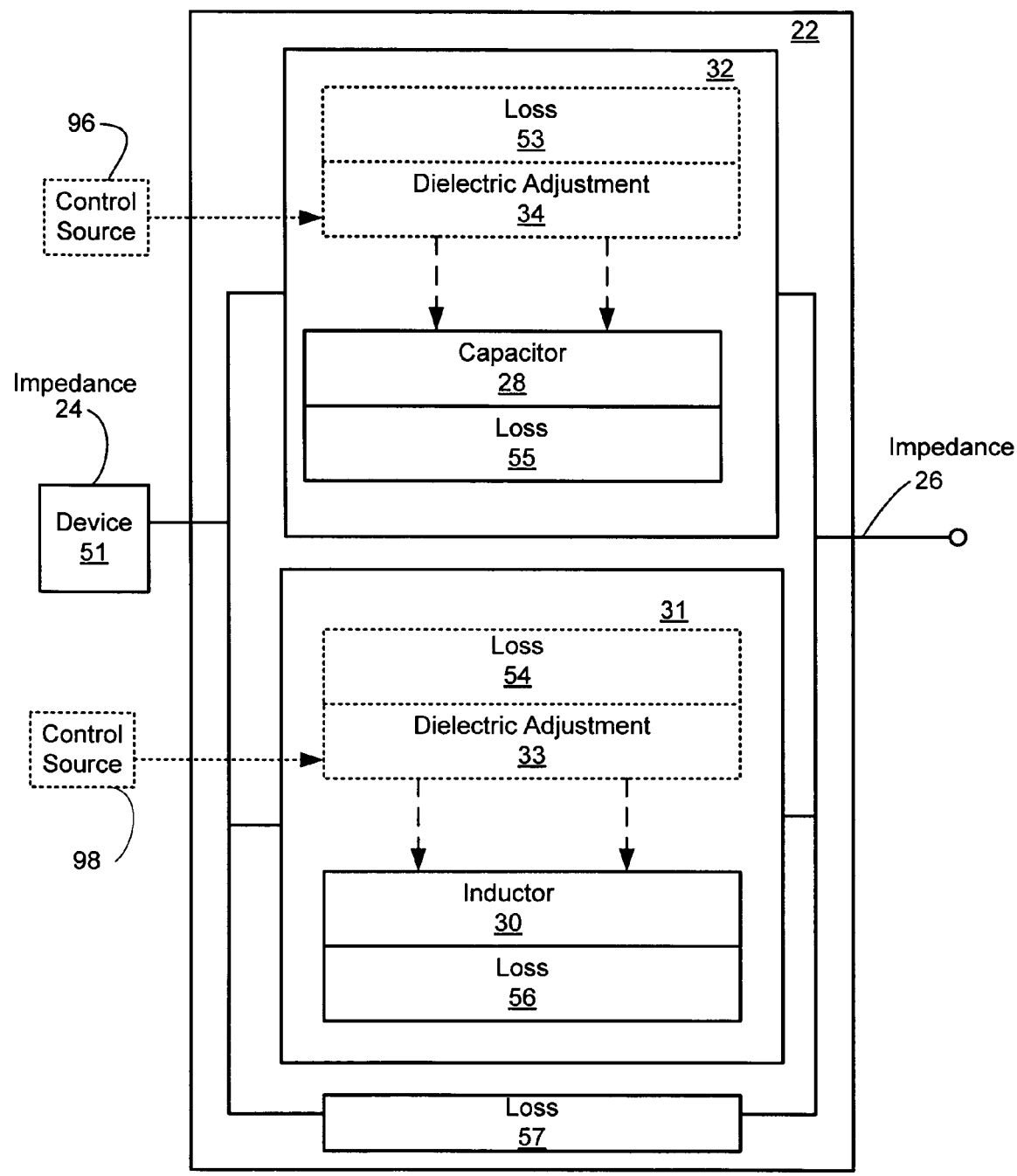
FIG. 11 is a block diagram of a low loss tunable ferroelectric matching circuit.

FIG. 11 is a block diagram showing a dielectric tunable matching circuit 22 used to tune a device impedance 24 to a target impedance 26. The matching circuit 22 is comprised of a capacitor 28 and an inductor 30. In a first embodiment, the capacitor 28 may have a first dielectric constant adjustment mechanism 34. Together, the capacitor 28 and the dielectric constant adjustment mechanism 34 comprise a tunable capacitor 32.

The dielectric constant adjustment mechanism 34 adjusts the dielectric constant of some or all of the dielectric material proximate the capacitor 28. This shifts the capacitance of the capacitor 28. This, in turn, shifts the impedance of the device 51 and the matching circuit 22 combined. In this way, the impedance can be selectively tuned to match the target impedance 26.

In a second embodiment, the inductor 30 may have a second dielectric constant adjustment mechanism 33. Together, the inductor 30 and the second dielectric constant adjustment mechanism 33 comprise a tunable inductor 31. The dielectric constant adjustment mechanism 33 adjusts the dielectric material proximate the inductor 30. This shifts the inductance of the inductor 30. This, in turn, shifts the impedance of the device 51 and the matching circuit 22 combined. In this way, the impedance can be selectively tuned to match the target impedance 26.

In a third embodiment, the matching circuit 22 may have both tunable components, that is, a tunable capacitor 32 and a tunable inductor 31.

In each of the first, second and third embodiments a first control source 96 or a second control source 98 or both will be present to send control signals to the dielectric constant adjustment mechanisms 34 and 33.

The matching of impedances is accomplished while maintaining very low total loss in the matching circuit 22. Five specific losses are shown in FIG. 11. There is a loss 53 associated with the first dielectric constant adjustment mechanism 34. This loss 53 may be the ferro-electric material loss tangent, or $L_{f\text{-}e}$. There is a loss 55 associated with the capacitor 28. This loss 55 may be a combination of $L_{metal}$ and $L_{geom}$. There is a loss 54 associated with the second dielectric constant adjustment mechanism 33. This loss 54 may be the ferro-electric material loss tangent, or $L_{f\text{-}e}$. There is a loss 56 associated with the inductor 32. This loss 56 may be a combination of $L_{metal}$ and $L_{geom}$. Finally, there is a loss 57 associated with the entire matching circuit 22. This loss 57 may be a combination of $L_{attach}$, $L_{sub}$ and $L_{rad}$.

Each of these losses is eliminated or bounded by the techniques discussed above. Thus, this matching circuit 22 introduces sufficiently low loss to be usable in a wireless handset or other communication systems requiring low loss.

F-E tunable matching circuits can be used in several places in a wireless handset. Specifically, they can be used in, but are not limited to, matching an antenna to a duplexer, diplexer or multiplexer and for matching at the input and output of PA's and LNA's. They can also be used in the intermediate frequency (IF) strip to provide tuning there, if needed.

Figure 12:
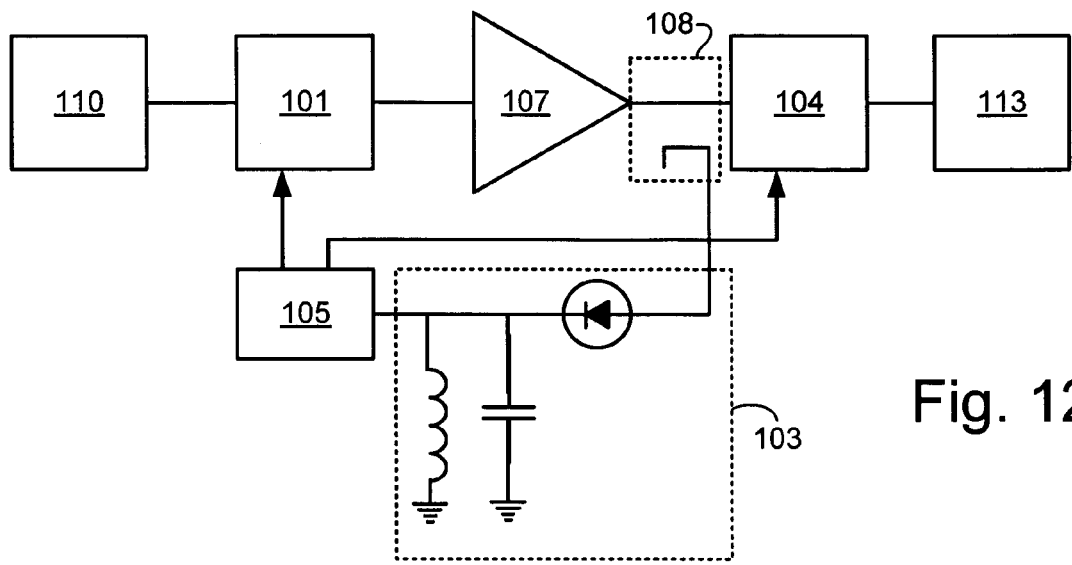
FIG. 12 is a block diagram of a matching circuit and surrounding circuitry for an amplifier.

FIG. 12 shows a block diagram of two matching circuits 101 and 104 coupled to an amplifier 107. The amplifier 107 may be either a power amplifier (PA), a low noise amplifier (LNA) or any other suitable amplifier. The first matching circuit 101 sets the impedance seen by an input circuit 110 to a first target impedance. The target impedance may differ from the input impedance of the amplifier 107. The matching circuit 101 compensates for this difference. A second matching circuit 104 sets the impedance seen by the amplifier 107 to a second target impedance. The second target impedance may be equal to the first target impedance.

Matching can be achieved over a wider range of frequencies while still maintaining the device's narrow band characteristics. Being able to control the impedance of an amplifier while it is being tuned reduces loss in the signal path.

The control of matching circuits 101 and 104 may be implemented by power sampling circuit 108, power detecting circuit 103 and control circuit 105 as shown in FIG. 12. Power sampling circuit 108 is coupled to the output of amplifier 107. It samples the power output of amplifier 107 and transfers this signal to power detector circuit 103. Power detect circuit 103 detects the power level of amplifier 107 and transfers this signal to control circuit 105. Control circuit 105 receives the power level detected by power detector circuit 103 as an input and produces a control signal as an output. The control signal varies the DC voltage applied to the f-e material in the matching circuits 101 and 104. Thus, the matching circuits 101 and 104 are responsive to the power output of amplifier 107.

Together, power sampling circuit 108, power detecting circuit 103 and control circuit 105 comprise a control source. Note that power detector circuit 103 is shown as a diode, a capacitor and an inductor for the purpose of illustration only. Any suitable power detector may be used.

Figure 15:
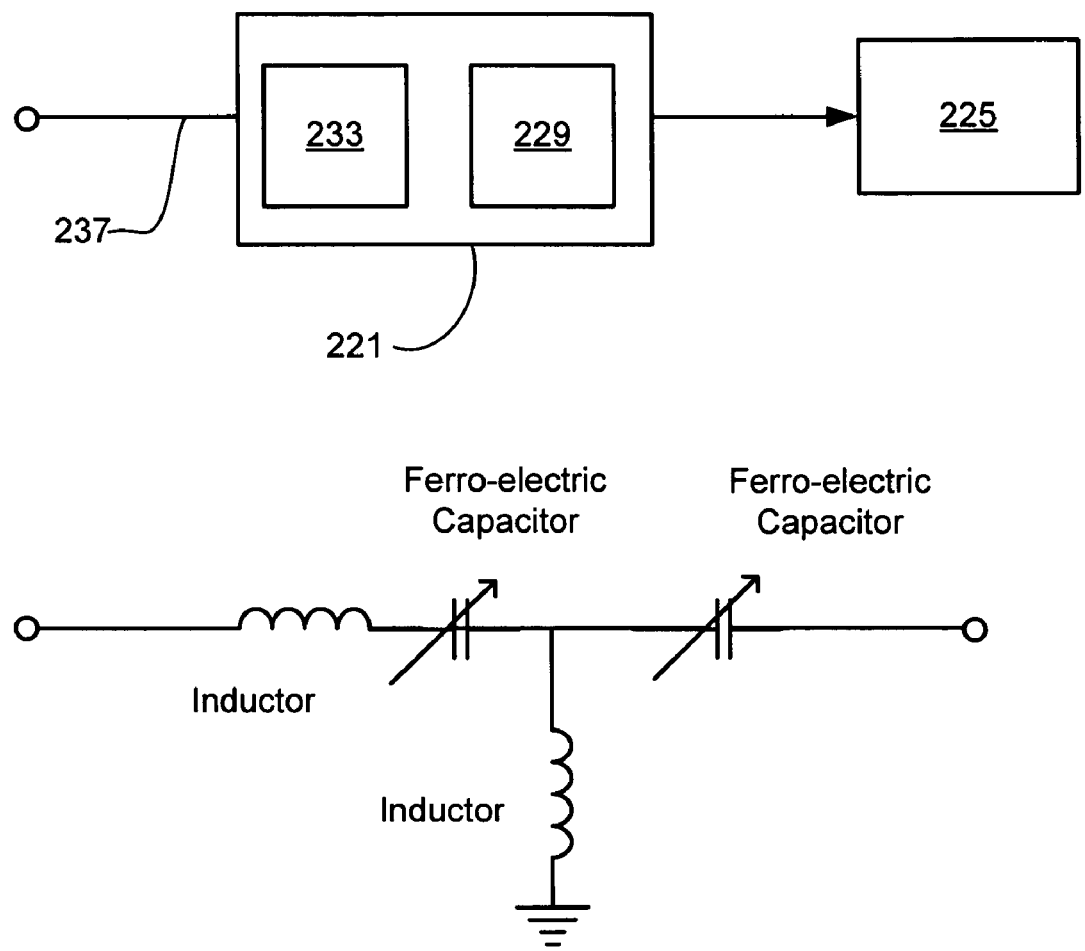
FIG. 15 is a block diagram of a control source and a matching circuit.

An alternate control source is shown in FIG. 15. A band select signal is received as an input 237 to control source 221. Control source 221 comprises a voltage source 223 and a look-up table 229. Responsive to the band select signal, the control source 221 looks up a value in the look-up table 229 corresponding to the band selected. The value represents a voltage to be applied by the control source 221 to the matching circuit 225. The voltage comprises a control signal, changing the impedance of the matching circuit 225.

F-E tuning in PA's can not only electrically adjust the output impedance match for a given device initially and optimize it over temperature, but can also dynamically vary the load line of a PA given the known required power output. The ability to optimize a PA's load line under a wide range of output power is key to obtaining optimum power efficiency and thus minimizing the power consumption on the D.C. power source, i.e., a battery in the case of wireless handsets. This increases talk time and reduces heat dissipation.

The maximum output power that a f-e tunable amplifier can handle is limited by the f-e material's non-linearity and the overall system requirements. For wireless handsets there are appropriate standards, like IS-95 or IS-98, that define the tolerable limits on transmit (PA) non-linearity in terms of adjacent and/or co-channel interference. Improving a PA's linearity has a direct, positive effect in that a smaller device and/or less bias current needs to be used to meet these standards. The linearity of the f-e material must be considered. The f-e materials described herein have some non-linearity. The particular choice of f-e film will be determined by the tolerance of a given system to non-linearity.

Additionally, increased output power can be achieved by conventional paralleling of devices, as is apparent to anyone skilled in the art. F-E tunability can be exploited in these cases as well.

F-E materials can also benefit LNA's. LNA's can electrically adjust for the optimum input impedance match of a device, along with the output, to provide for optimum noise figure and intercept point. As is the case of the PA, this can be controlled over temperature, as well. Amplifier performance changes over temperature. This may create impedance mismatches at different temperatures and/or a shift in the active device's operating point. F-E tunability can be used to compensate for this impedance mismatch by appropriate choice of:

1) f-e material temperature characteristics, and/or;
2) matching topology chosen.

Tunability allows for an LNA and a PA to be operated optimally over more than one band. This is especially useful in wireless handsets because the amount of space in a handset is limited and many operating bands are closely spaced. Space savings are proportional to the number of independent components for different bands that are eliminated by adding tunable components. Tunability allows a handset manufacturer to have fewer different PA and LNA designs on hand to build handsets for a diverse market. It also allows for operation of handsets over wide geographic regions without requiring multiple PA's and LNA's. For example, one PA or LNA can cover multiple PCS bands, such as, for example, the Korean, Indian, and U.S. PCS bands.

The resulting improved match will translate to increased antenna gain, further improving handset performance, both for the transmit side (lower required PA power, more linearity) and the receive side (increased sensitivity, less LNA bias current needed).

Figure 13:
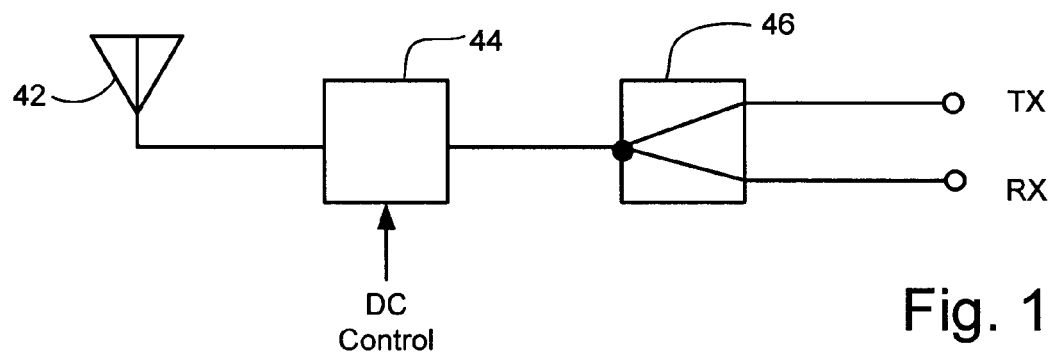
FIG. 13 is a block diagram of a matching circuit between an antenna and a duplexer.
Figure 14:
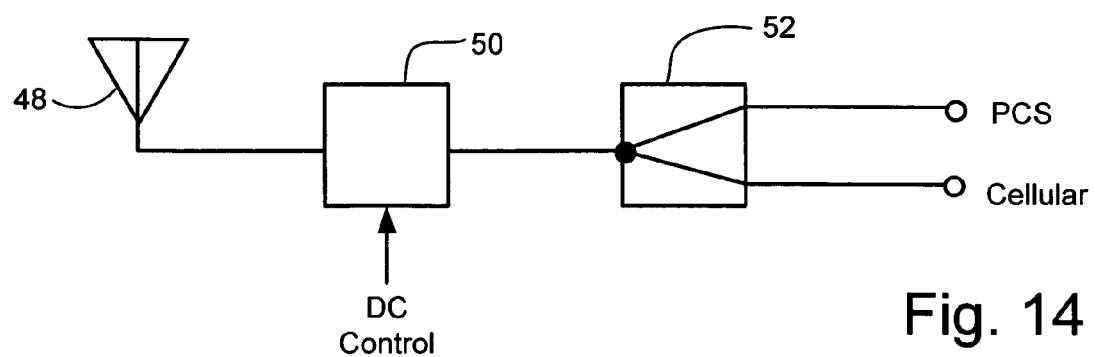
FIG. 14 is a block diagram of a matching circuit between an antenna and a duplexer.

Another example of a tunable matching circuit is a matching circuit for matching an impedance of an antenna to the impedance of either a duplexer or a diplexer. These configurations are shown in FIGS. 13 and 14. In FIG. 13, an antenna 42 is coupled to a matching circuit 44. The matching circuit 44 is coupled to a duplexer 46. The matching circuit 44 sets the impedance seen by the antenna 42 to a target impedance. The target impedance may be different from the input impedance of the duplexer 46. The matching circuit 44 compensates for this difference. The matching impedance also sets the impedance seen by the duplexer 46 to a target impedance. This target impedance may be different from the input impedance of the antenna 42. The matching circuit 44 compensates for this difference.

In FIG. 14, an antenna 48 is coupled to a matching circuit 50. The matching circuit 50 is coupled to a diplexer 52. The matching circuit 50 sets the impedance seen by the antenna 48 to a target impedance. The target impedance may be different from the input impedance of the diplexer 52. The matching circuit 50 compensates for this difference. The matching impedance also sets the impedance seen by the diplexer 52 to a target impedance. This target impedance may be different from the input impedance of the antenna 48. The matching circuit 50 compensates for this difference. The diplexer is shown as providing for the PCS and cellular bands. This is by way of example only. The diplexer could provide for other bands, it could be replaced by a multiplexer providing for more than two bands.

Note that a control signal is applied to the matching circuits 44 and 50 of FIGS. 13 and 14, respectively. This control signal may be generated in a manner similar to those in FIG. 12 or 15, or any other suitable method. A power sampler may be applied, for example at the duplexer 46 Tx or Rx ports, or at the diplexer PCS or cellular ports.

The resulting improved match will translate to increased antenna gain, further improving handset performance, both for the transmit side (lower required PA power, more linearity) and the receive side (increased sensitivity, less LNA bias current needed).

Figure 16:
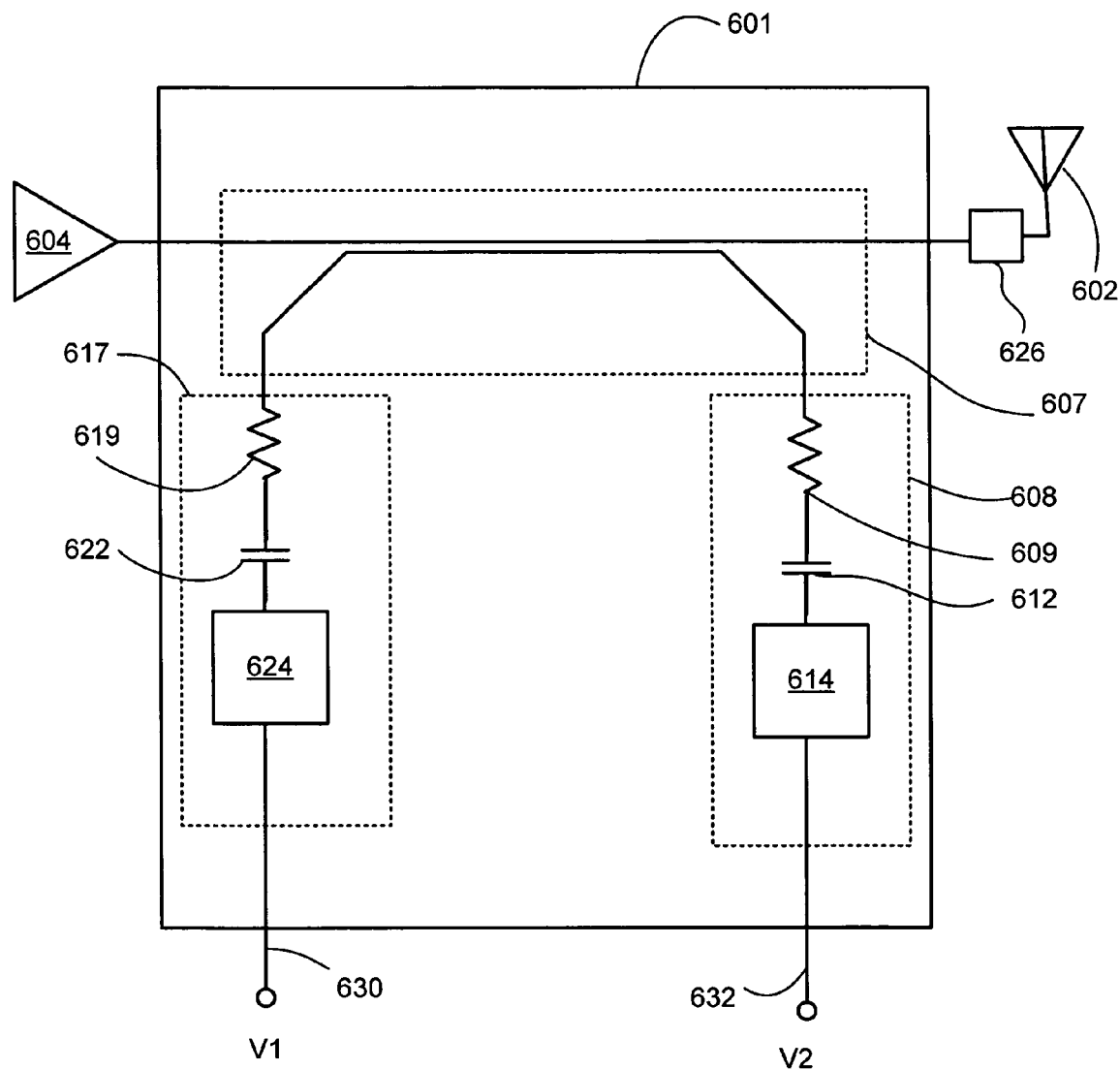
FIG. 16 is a diagram illustrating a mismatch detector using a directional coupler.

Referring now to FIG. 16, a mismatch detector 601 using a directional coupler will now be discussed. The mismatch detector 601 includes a power amplifier 604. The power amplifier 604 is coupled to an antenna 602 using a directional coupler 607. Typically energy flows from the power amplifier 604 through the directional coupler 607 to the antenna 602. Additionally, some energy may flow from the power amplifier 604 through the circuit 608. The circuit 608 typically includes a resistor 609, a capacitor 612 and a power detector 614. The power detector 614 typically outputs a voltage V2 632 that is indicative of the power measured by the power detector. The percentage of energy that flows through this path is typically predictable. The amount of energy that flows from the power amplifier 604 through optional circuit 617 is typically negligible. The optional circuit 617 typically includes a resistor 619, a capacitor 622 and a power detector 624. The power detector 624 typically outputs a voltage V1 630 that is indicative of the power measured by the power detector is indicative of the power measured by the power detector.

Energy reflected back from the antenna 602 typically flows back to the power amplifier 604. Additionally, some energy may flow from the antenna 602 through the optional circuit 617. The percentage of energy that flows through this path is typically predictable. The energy reflected from the antenna through circuit 608 is typically negligable.

Typically maximizing the energy transfer from the power amplifier 604 to the antenna 602 and transmitted into space by the antenna is advantageous. Energy from the power amplifier 604 can, in many cases, be measured by the circuit 608. The circuit 608 includes a power detector 614 coupled to the directional coupler 607 through the resistor 609 and the capacitor 612. The power detector 614 typically measures the energy that flows from the power amplifier 604 to the antenna 602. As stated above, the percentage of energy that flows through circuit 608 is a known percentage of the energy that flows from the power amplifier 604 to the antenna 602. Since this percentage is known, the energy that flows from the power amplifier 604 to the antenna 602 can be calculated from the power detector 614 by measuring the energy at the detector. The power detector typically outputs a voltage V2 632 that is a function of power measured by the detector 614.

Similarly, energy reflected back from the antenna 602 is measured by a second power detector 624 in the optional circuit 617. Typically, a known percentage of the energy reflected from the antenna to the power amplifier 604 flows through the optional circuit 617. Using this known percentage, the amount of energy reflected from the antenna 602 to the power amplifier 604 can be determined. Since the energy transmitted by the power amplifier is typically measured by the power detector 614 and the energy reflected at the antenna is measured by the second power detector 624 the ratio of transmitted power to reflected power is known. A matching circuit 626 can be adapted dynamically to maximize the energy that flows from the power amplifier 604 to the antenna 602. Many different types of matching circuits are possible. The matching circuit 626 will typically include variable components such as ferro-electric capacitors. In one embodiment two ferro-electric capacitors are used, requiring only two control voltages. For example, an inductor, followed by a ferro-electric capacitor, followed by an inductor to ground followed by a second ferro-electric capacitor could be used. This is only an example, other examples are possible. Advantages of the embodiment typically include the ability to adaptively change a matching circuit to maximize transmitted power from the antenna.

While the optional circuit 617 is described as "optional," some embodiments may require circuit 617. Additionally, the Figs. discussed herein are only examples of possible embodiments, and it will be clear to those of skill in the art that other embodiments are possible.

Figure 17:
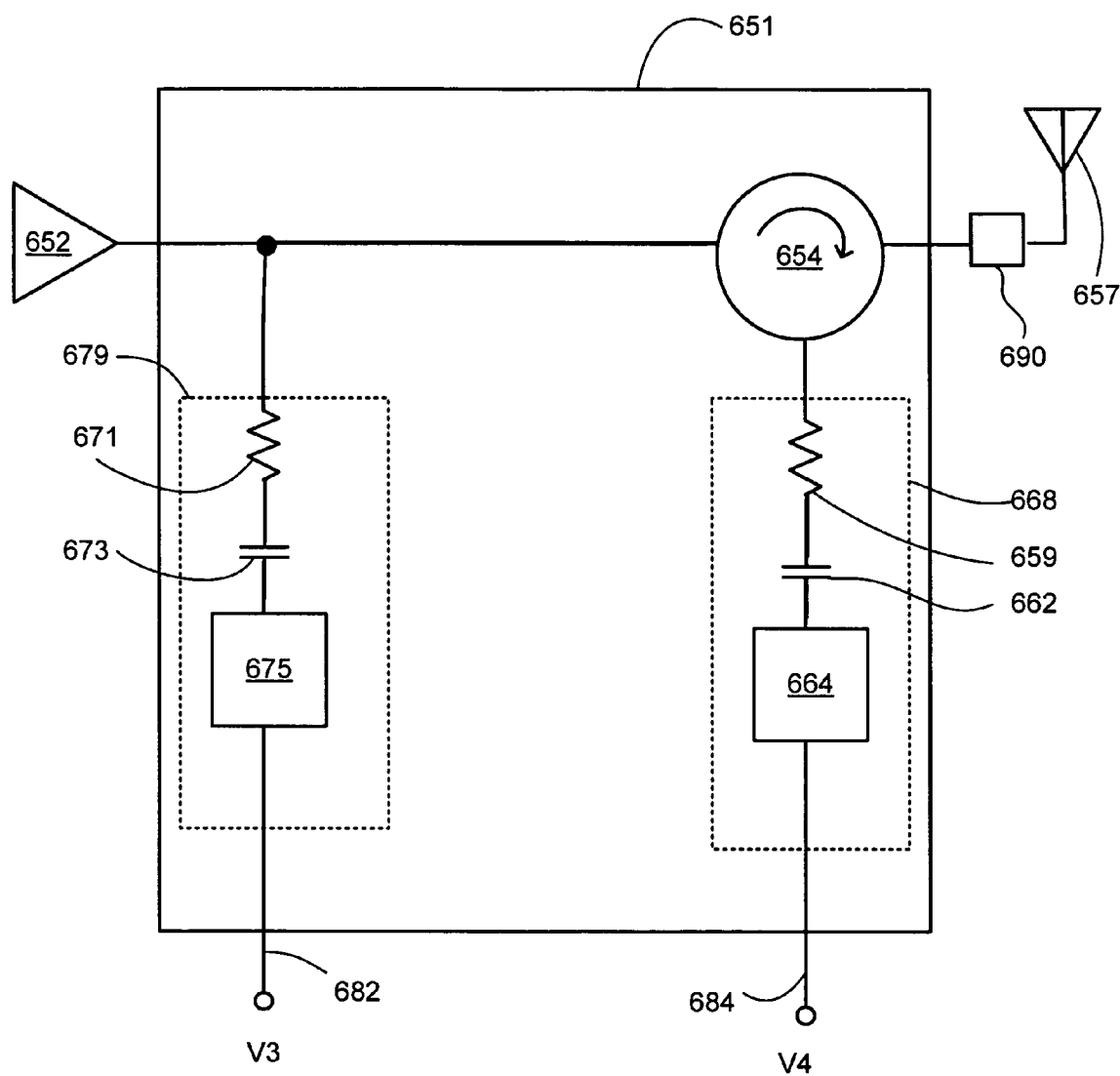
FIG. 17 is a diagram illustrating a mismatch detector using a circulator.

FIG. 17 illustrates a mismatch detector 651 using a circulator 654. The mismatch detector 651 of FIG. 17 performs the same or similar function to the mismatch detector 601 of FIG. 16. Many components are the same or similar between the two figures.

A power amplifier 652 is coupled to an antenna 657 through a circulator 654 and a matching circuit 690. Similar to FIG. 16, the mismatch detector 651 includes a circuit 668 and an optional circuit 679. Typically, the circuit includes a resistor 659, a capacitor 662, and a power detector 664 that outputs a voltage V4 684 that is indicative of the power detected. Energy reflected from the antenna typically flows through the circuit 668 and is measured by the power detector 664.

Similarly, the transmit power can be measured using the optional circuit 679. The optional circuit 679 is similar to the circuit 668. Typically the circuit 668 and the optional circuit 679 will be the same or similar to the circuit 608 and the optional circuit 617 of FIG. 16. The optional circuit 679 of FIG. 17 includes a resistor 671, a capacitor 673 and a detector 675 that typically outputs a voltage V3 682 that is proportional to the power measured. The power measured by the detector 675 is typically representative of the power that flows from the power amplifier 652.

Similar to FIG. 16, by using the power measurements from the power detectors 664 and 675 the power reflected can be determined and a matching circuit 690 can be adapted to maximize power that flows from the power amplifier 652 to the antenna 657.

Figure 18:
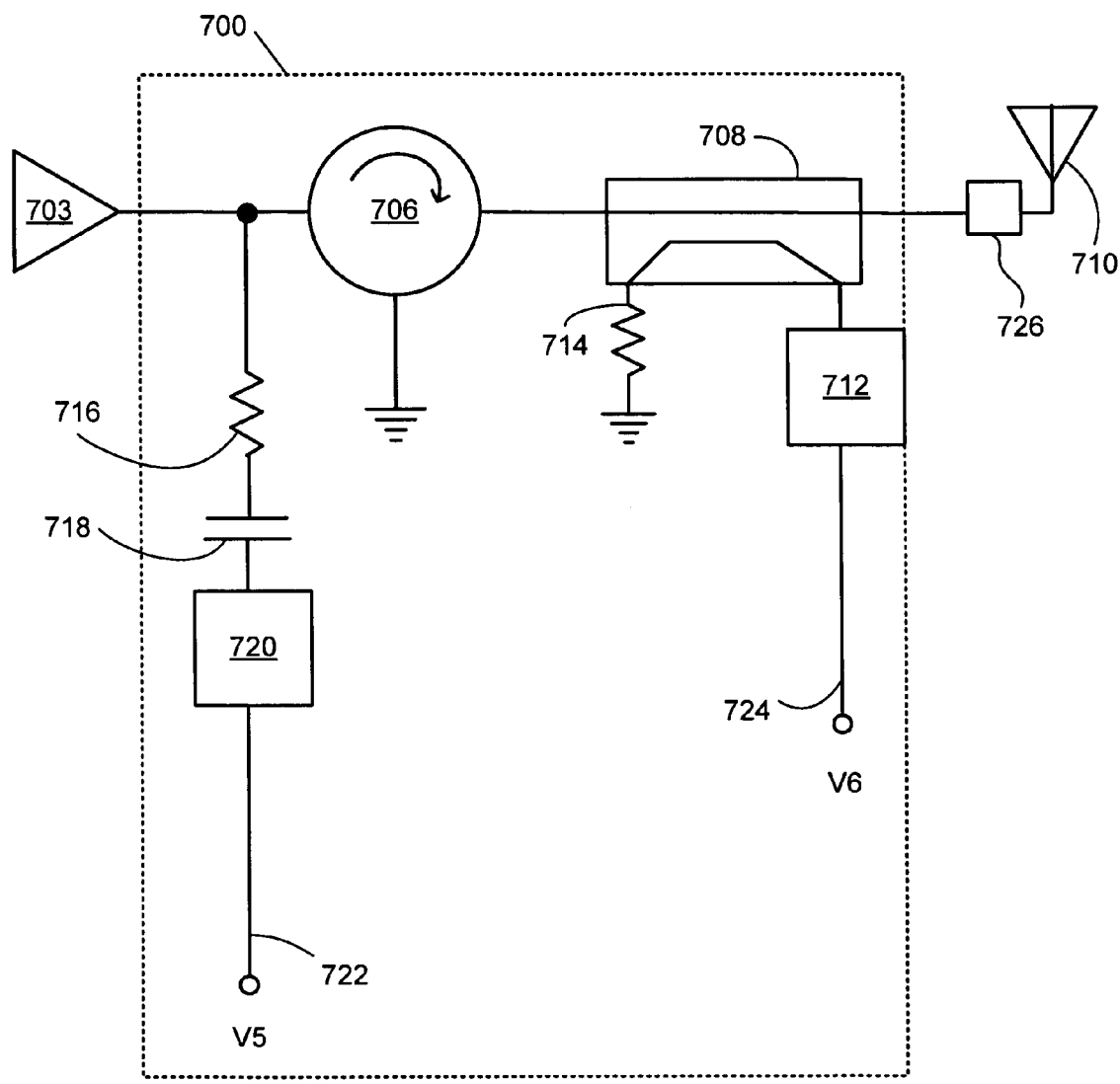
FIG. 18 is a diagram illustrating a mismatch detector using a directional coupler and an isolator.

Another example of a mismatch detector 700 will be discussed with respect to FIG. 18. The mismatch detector of FIG. 18 uses a directional coupler 708 and an isolator 706. The power that flows from the amplifier 703 is measured using the circuit that includes the resistor 716, capacitor 718 and the detector 720. Energy flows from the power amplifier 703 through the isolator 706, through the directional coupler 708 and matching circuit 726 to the antenna 710. Reflected energy is measured by the detector 712.

Similar to FIGS. 16 and 17, by using the power measurements from the power detectors 720 and 712 the power reflected can be determined and the matching circuit 726 can be adapted to maximize power that flows from the power amplifier 703 to the antenna 710. Advantages may include longer battery use on a single charge. By minimizing energy reflected back from the antenna it may be possible to lower the power output of the power amplifier 604, 652, 703, 745, of FIGS. 16–19. Lower amplifier power output may in some cases lower power used from the battery and increase the amount of time between battery charges.

Figure 19:
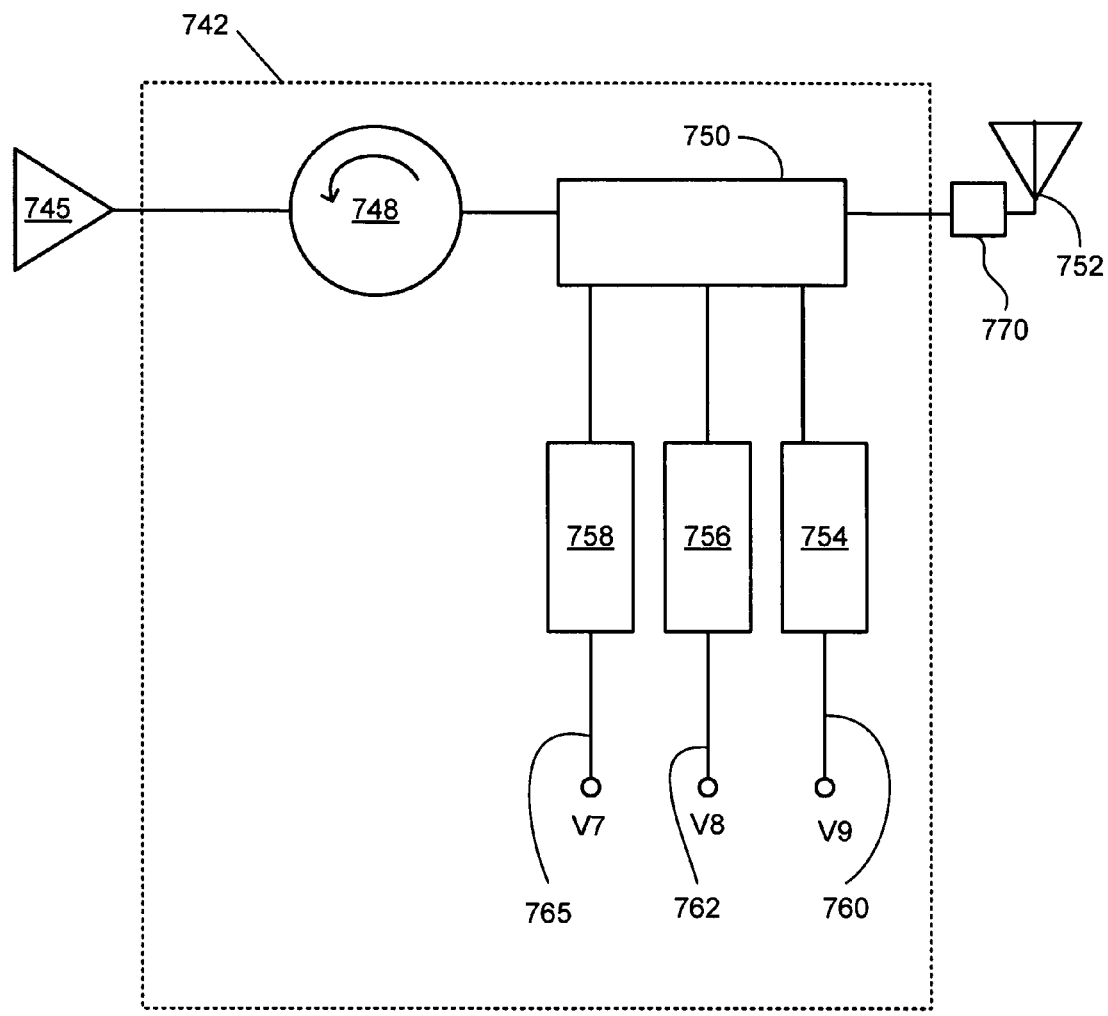
FIG. 19 is a diagram illustrating a mismatch detector using a circulator and a slow wave structure.

Referring now to FIG. 19, a diagram illustrating a mismatch detector 742 using a circulator 748 and a slow wave structure 750. Energy flows from a power amplifier 745 through a circulator 748 to a slow wave structure 750. The slow wave structure 750 is coupled to the antenna 752 through a matching circuit 770. Similar to the examples shown with respect to FIGS. 16, 17 and 18, the matching circuit can be adapted to maximize the power transmitted by the antenna 752 and minimize the power reflected back toward the power amplifier 745. Multiple measurements can be made using the slow wave structure 750. Power detectors 754, 756 and 758 typically output voltages 760, 762, 765 that are indicative of the power. By measuring power at multiple locations along the slow wave structure 750 both the magnitude of the reflected power and the phase of the reflected power can be determined.

By using the magnitude and phase of the reflected power the matching circuit 770 can typically by more accurately adapted to maximize energy transmitted by the antenna 752. Additionally, it will be clear to those of skill in the art that multiple power detectors, typically spaced known distances apart, can be used at different locations in FIGS. 16, 17, and 18 to determine phase. Advantages may include more accurate adaptive antenna matching by using both magnitude and phase.

Figure 20:
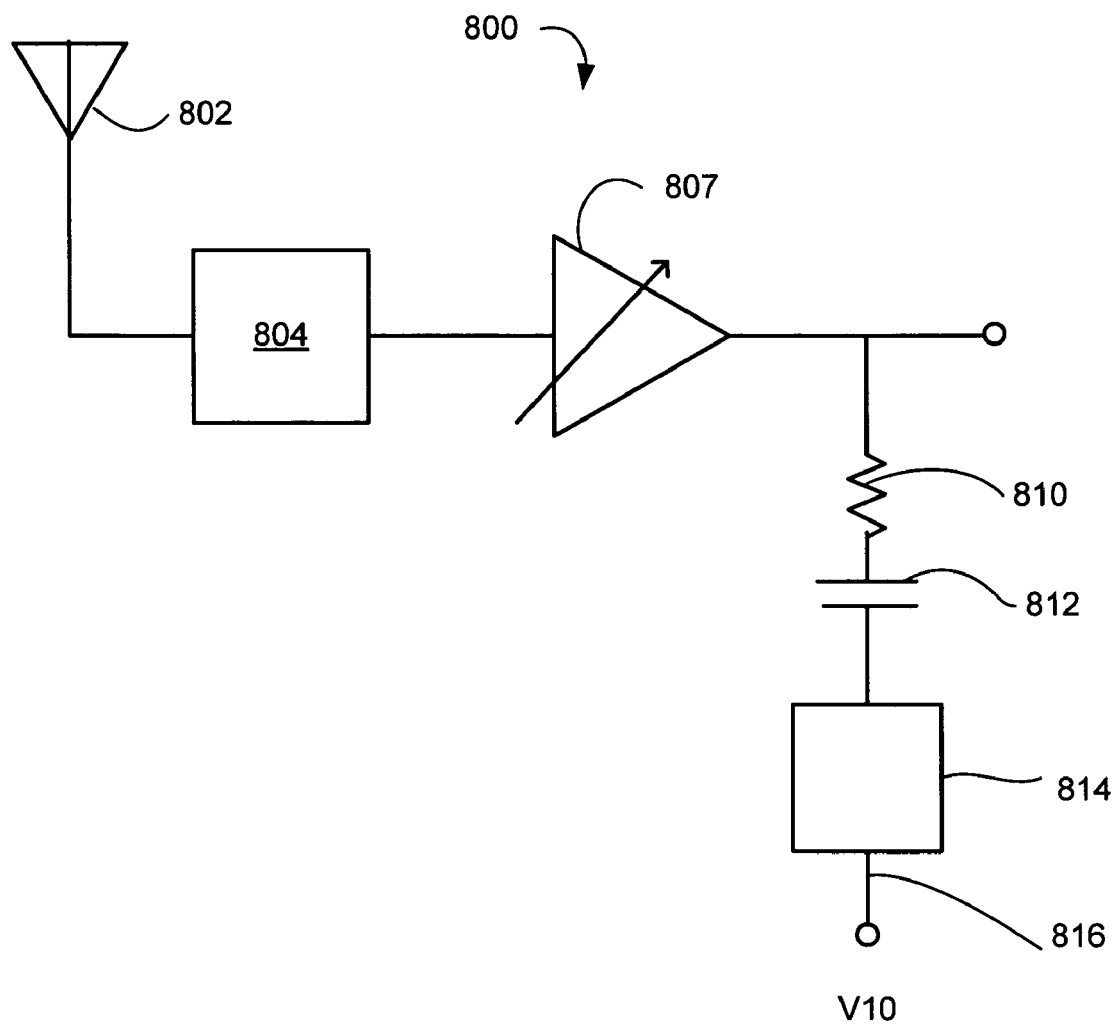
FIG. 20 is a diagram illustrating a mismatch detector used in a receive path.
Figure 21:
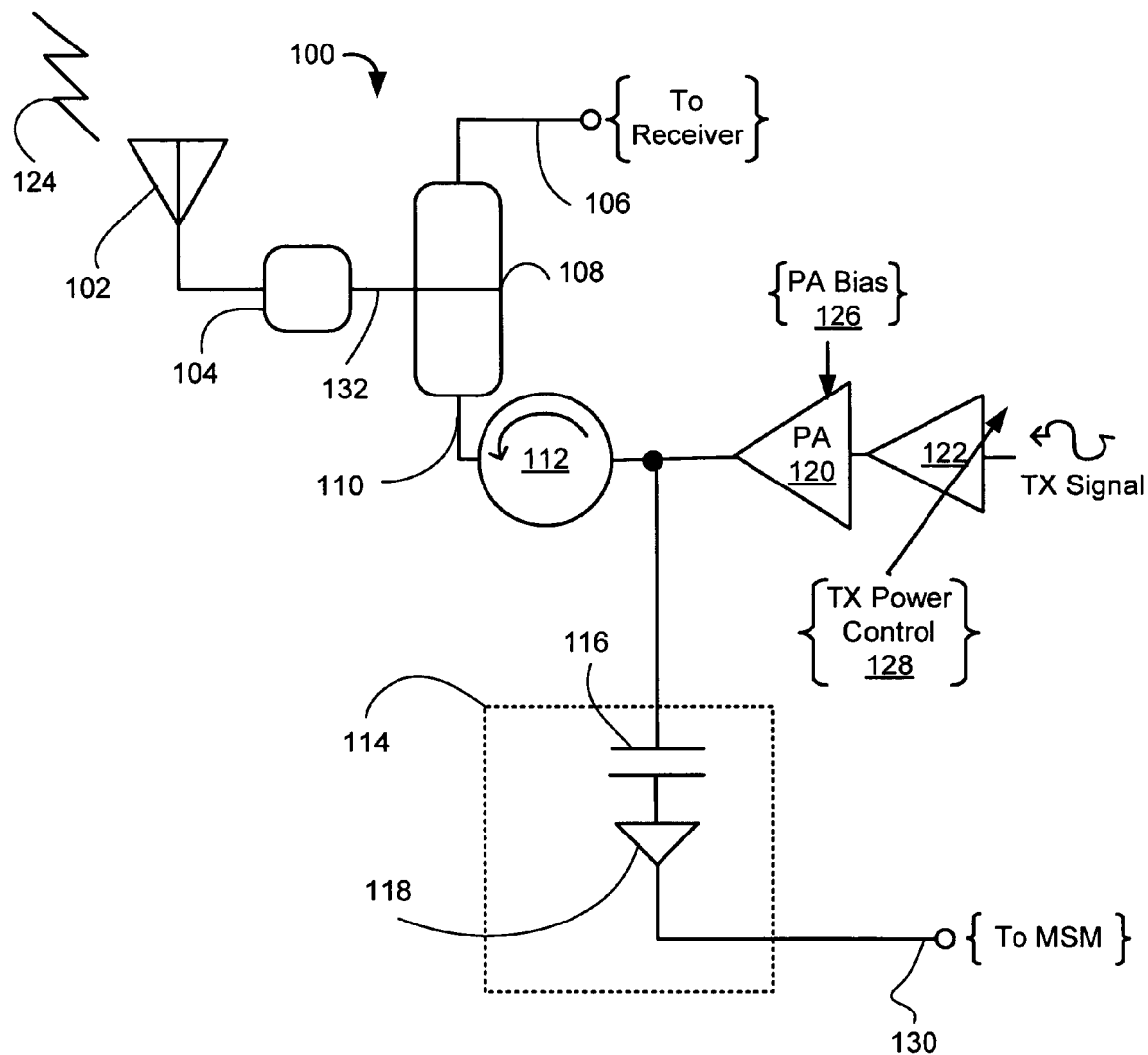
FIG. 21 is a logical block diagram illustrating a wireless communication transceiver of the prior art.
Figure 22:
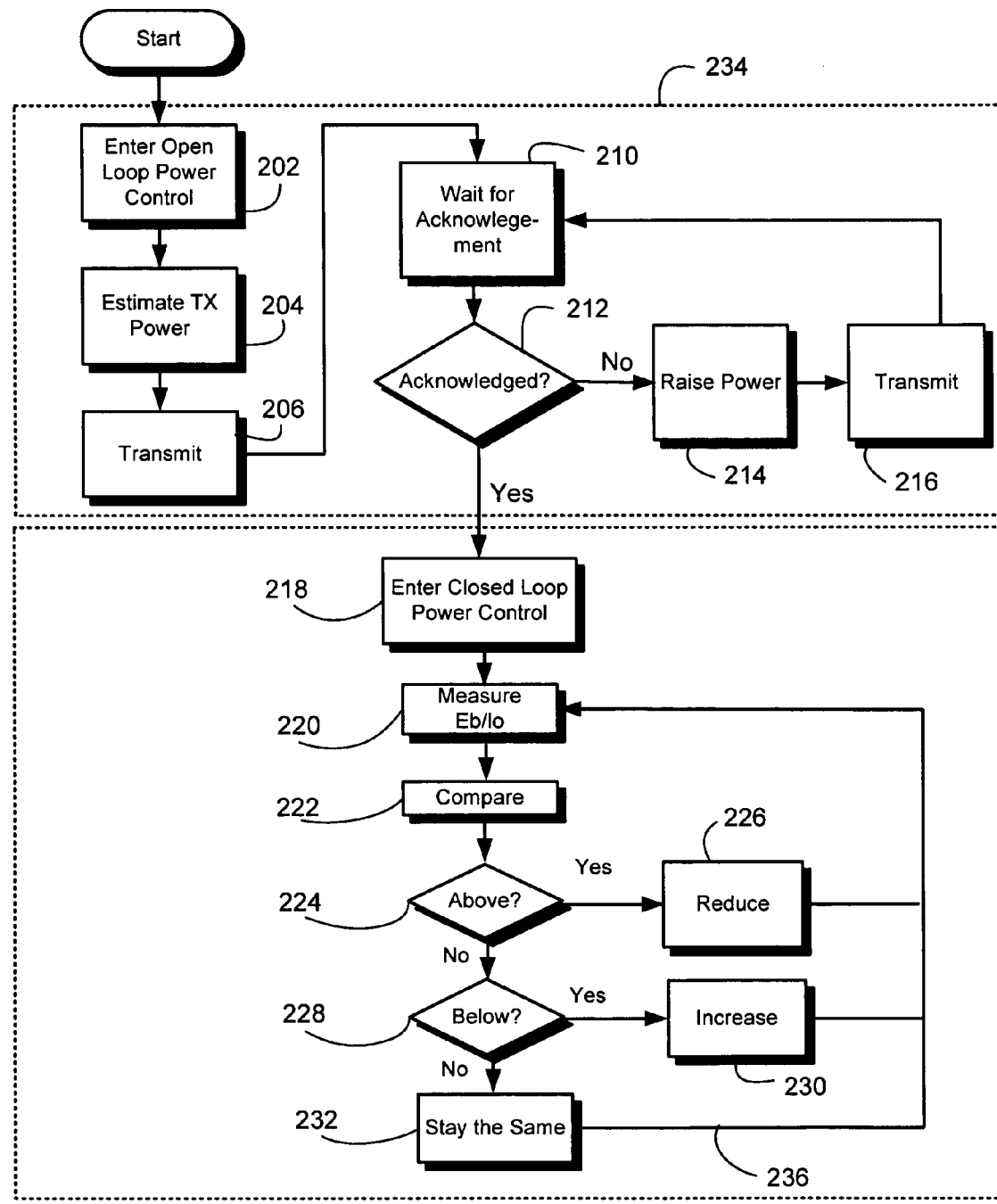
FIG. 22 is a flow chart illustrating a power control loop process of the prior art for controlling the transmit power level in the wireless transceiver of FIG. 21.

Referring now to FIG. 20, a receive path circuit 800 will be discussed. The circuit 800 includes an antenna 802 for receiving energy. The antenna 802 receives energy. The antenna 802 is coupled to a matching circuit 804. The matching circuit 804 is typically a variable matching circuit. The matching circuit 804 typically includes variable components such as ferro-electric capacitors. The matching circuit 804 is coupled to an amplifier 807. The amplifier 807 is typically a low noise amplifier (LNA). Additionally, the amplifier 807 may typically have variable amplification.

Following the amplifier 807, a circuit containing a resistor 810, a capacitor 812, and a power detector 814 is shown. The power detector 814 is used to measure power received after the amplifier 807. Since the amplification of the amplifier 807 is typically known, the power level of the signal before the amplifier can typically be calculated. The matching circuit 804 can typically be adapted to maximize the receive signal and minimize received signal reflected back to the antenna. In some cases receive signal strength can be measured rapidly and one measurement can be compared to another to determine if one matching circuit 804 impedance is better than another. If automatic gain control is used to vary the amplification of the amplifier 807 any change in gain will typically need to be considered when comparing one matching circuit 804 impedance to another. One way to help determine if changes in measured signal strength are due to changes in the impedance of the matching circuit 804 is to only make small changes in impedance between measurements. If the measured signal strength changes by a large amount, then the change may be due to some other cause not related to the matching circuit, for example, some obstacle blocking the transmission between the transmitter and the receiving antenna 802.

It will be understood by those of skill in the art that the circuits of FIGS. 16, 17, 18, 19, and 20 are typically a small portion of a larger communication device. For example the circuit may be included as part of the wireless communication device 450 of FIG. 4.

It should be noted that the above examples are provide for illustration only and are not intended to limit the invention to any particular type of transceiver architecture or to any particular type of wireless communication device. Moreover, the systems and methods described herein do not necessarily need to be implemented in a transceiver, they can, for example, be implemented in a device that solely comprise a transmitter incorporating a power control circuit 318. Thus, while embodiments and implementations of the invention have been shown and described, it should be apparent that many more embodiments and implementations are within the scope of the invention. Accordingly, the invention is not to be restricted, except in light of the claims and their equivalents.

What is claimed is:

1. A mismatch detector comprising:
   a directional device comprising a circulator adapted to transmit signals to an antenna and receive reflected signals from the antenna, the output of the circulator coupled to a slow wave structure;
   a detector coupled to a port on the directional device and configured to measure power of the reflected signal;
   a second detector coupled to a port on the directional device and configured to measure power of the transmit signal; and
   a processor configured to read the measured power of the transmit signal and the measured power of the reflected signal and to generate a first control signal configured to control a matching network and a second control signal configured to control an amplifier, wherein the processor is configured to generate both the first and second control signals based on the measured power of the transmit signal and the measured power of the reflected signal.

2. The mismatch detector of claim 1 wherein the slow wave structure is coupled to multiple power detectors.

3. The mismatch detector of claim 2 wherein the multiple power detectors are configured to measure magnitude and phase of a reflected signal.

4. A wireless electronic device comprising:
   a matching circuit;
   a mismatch detector coupled with the matching circuit, the mismatch detector including:
   a directional device adapted to transmit signals to an antenna and receive reflected signals from the antenna,
   a detector coupled to a port on the directional device and configured to measure power of the reflected signal,
   a second detector coupled to a port on the directional device and configured to measure power of the transmit signal;
   a processor configured to read the measured power of the transmit signal and the measured power of the reflected signal and to generate a first control signal configured to control a matching network and a second control signal configured to control an amplifier, wherein the processor is configured to generate both the first and second control signals based on the measured power of the transmit signal and the measured power of the reflected signal;
   an antenna coupled to the matching circuit;
   a transceiver comprising the amplifier coupled to the antenna through the matching circuit;
   a control block coupled to the transceiver and adapted to control the transceiver;

a memory coupled to the control block and configured to store data for the control block;

an input device coupled to the control block and configured to receive input from a user; and a power source coupled to the control block and configured to supply power to the control block.

5. The wireless device of claim 4 wherein the wireless device is a mobile wireless device.

6. The wireless device of claim 4 wherein the wireless device is a base station.

7. The wireless device of claim 4 wherein the wireless device is multiple wireless devices forming a wireless communication system.

8. The wireless system of claim 7 wherein the multiple wireless devices include at least one base station.

9. The wireless system of claim 7 wherein the multiple wireless devices include at least one mobile wireless device.

* * * * *